United States Patent
Zerbe et al.

(10) Patent No.: US 8,198,930 B2
(45) Date of Patent: Jun. 12, 2012

(54) REDUCING POWER-SUPPLY-INDUCED JITTER IN A CLOCK-DISTRIBUTION CIRCUIT

(75) Inventors: Jared Zerbe, Woodside, CA (US); Brian Leibowitz, San Francisco, CA (US); Lei Luo, Durham, NC (US); John Wilson, Raleigh, NC (US); Anshuman Bhuyan, Stanford, CA (US); Marko Aleksic, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 52 days.

(21) Appl. No.: 12/913,754

(22) Filed: Oct. 27, 2010

(65) Prior Publication Data

US 2011/0102043 A1    May 5, 2011

Related U.S. Application Data

(60) Provisional application No. 61/256,541, filed on Oct. 30, 2009.

(51) Int. Cl.
*H03H 11/26* (2006.01)

(52) U.S. Cl. ............ 327/261; 327/158; 327/276

(58) Field of Classification Search ............ None
See application file for complete search history.

(56) References Cited

U.S. PATENT DOCUMENTS

| | | | | |
|---|---|---|---|---|
| 6,411,156 | B1 | 6/2002 | Borkar et al. | 327/534 |
| 6,798,258 | B2 * | 9/2004 | Rieven | 327/152 |
| 7,015,741 | B2 | 3/2006 | Tschanz et al. | 327/295 |
| 7,142,026 | B2 * | 11/2006 | Kwak | 327/158 |
| 7,362,151 | B2 | 4/2008 | de la Torre | 327/156 |
| 7,944,262 | B2 * | 5/2011 | Kuroki et al. | 327/175 |

OTHER PUBLICATIONS

Mansuri, Mozhgan "Low-Power Low-Jitter On-Chip Clock Generation", University of California, Los Angeles, 2003. 173 Pages.
Mansuri, Mozhgan & Yang, Chih-Kong Ken "A Low-Power Adaptive Bandwidth PLL and Clock Buffer With Supply-Noise Compensation", Department of Electrical Engineering, University of California, Los Angeles, CA 90095, IEEE Journal of Solid-State Circuits, vol. 38, No. 11, Nov. 2003. 9 Pages.

* cited by examiner

*Primary Examiner* — An Luu
(74) *Attorney, Agent, or Firm* — Park, Vaughan, Fleming & Dowler LLP

(57) ABSTRACT

A system for compensating for power-supply-induced jitter (PSIJ) in a chain of clock buffers within an integrated circuit is described. During operation, the system couples a first supply voltage from a first voltage source to a supply node of each clock buffer in a first chain of clock buffers. Note that a change in the first supply voltage causes a change in a first propagation delay associated with the first chain of the clock buffers. The system also couples a second chain of clock buffers in series with the first chain of clock buffers. The system then couples the first voltage source to each clock buffer in the second chain of clock buffers through coupling circuitry. Next, the system adjusts the coupling circuitry so that the change in the first supply voltage from the first voltage source causes a change in a second propagation delay associated with the second chain of the clock buffers, wherein the change in the first propagation delay and the change in the second propagation delay are complementary.

41 Claims, 15 Drawing Sheets

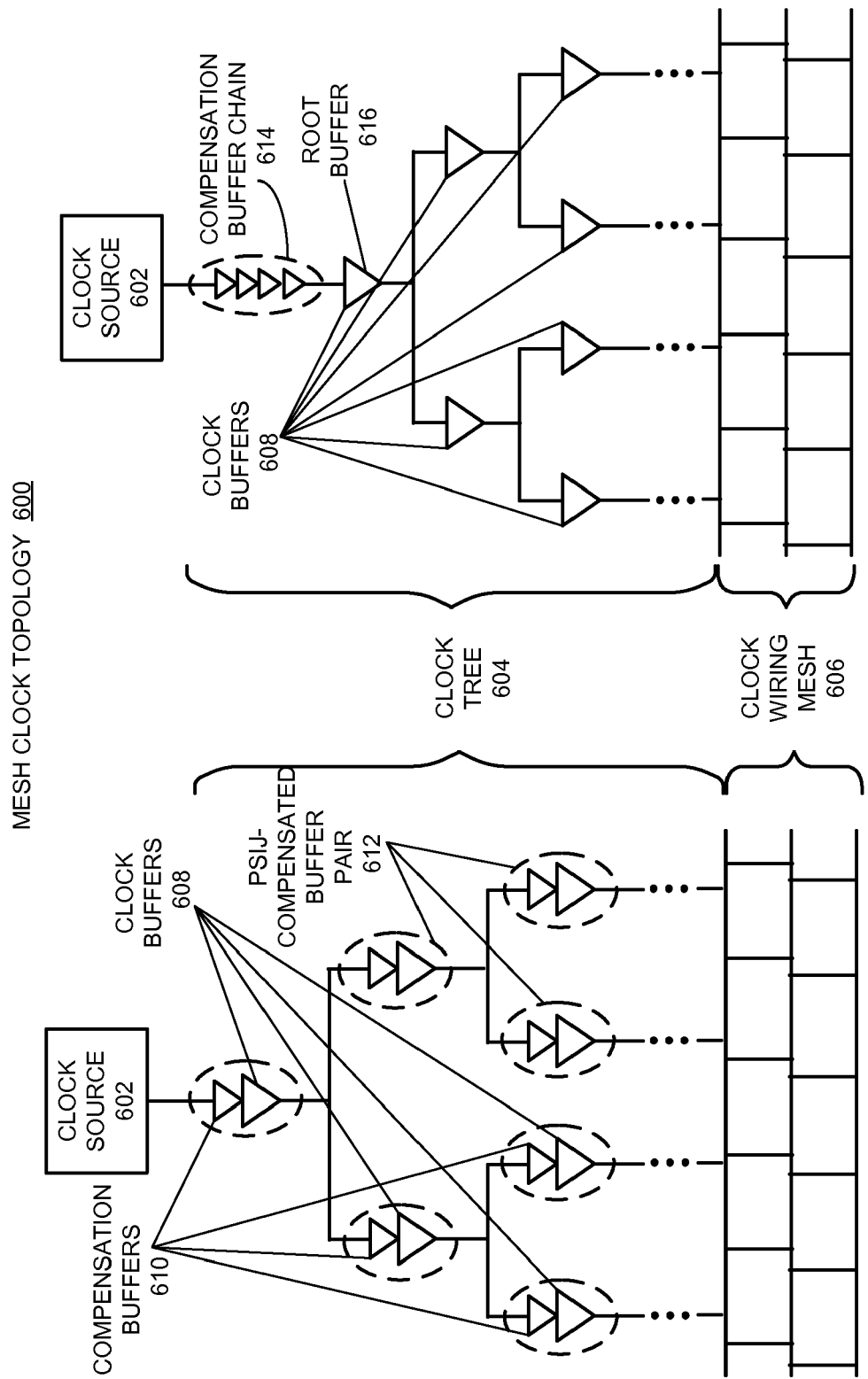

BIAS-GENERATOR CIRCUIT 804
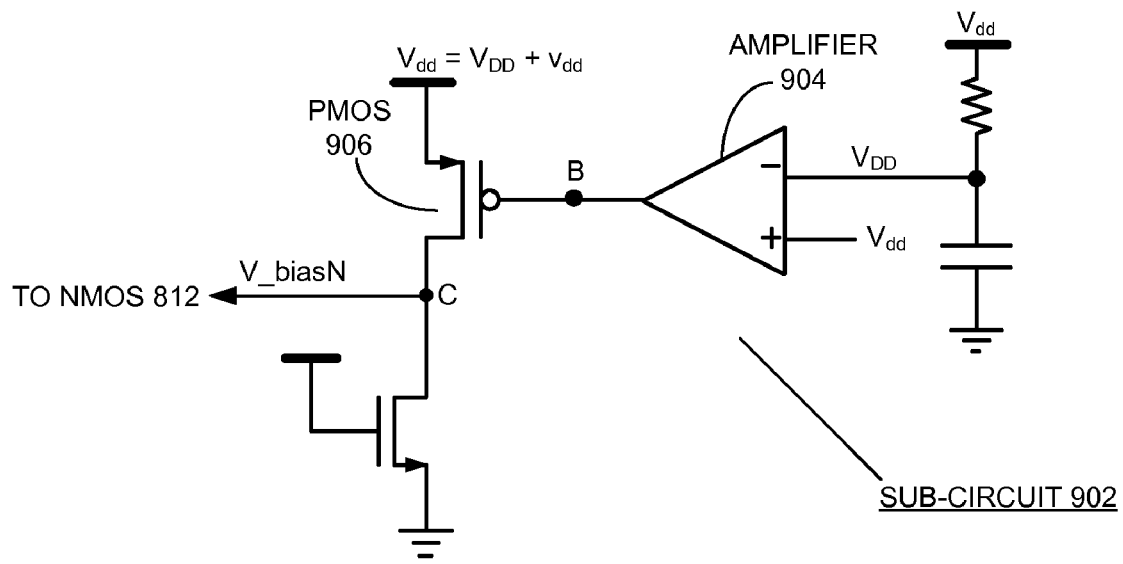
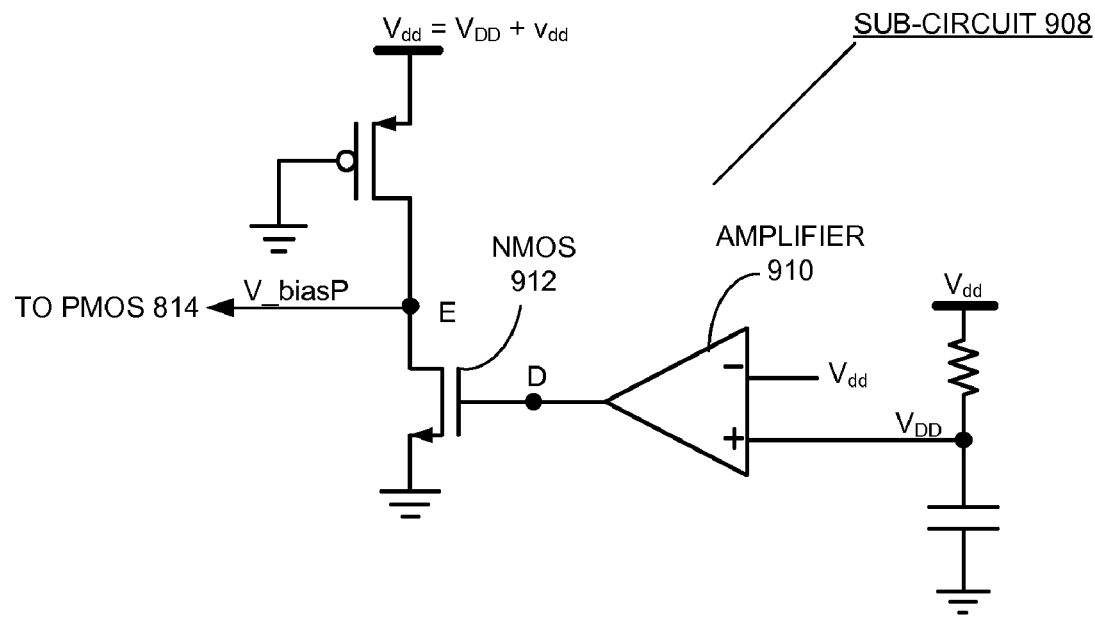
FIG. 9

REDUCING POWER-SUPPLY-INDUCED JITTER IN A CLOCK-DISTRIBUTION CIRCUIT

RELATED APPLICATION

This application hereby claims priority under 35 U.S.C. §119 to U.S. Provisional Application No. 61/256,541, entitled "Reducing Power-Supply-Induced Jitter in a Clock-Distribution Circuit" by Jared Zerbe, Brian Leibowitz, Lei Luo, John Wilson, Anshuman Bhuyan and Marko Aleksic filed 30 Oct. 2009.

TECHNICAL FIELD

The present embodiments generally relate to techniques for distributing a clock signal in an integrated circuit (IC). More specifically, the present embodiments relate to a method and system for reducing power-supply-induced jitter in a clock buffer for an IC.

BRIEF DESCRIPTION OF THE FIGURES

FIG. 6A illustrates an embodiment that compensates for PSIJ in a mesh clock topology by individually compensating each regular clock buffer in a clock tree.

FIG. 6B illustrates an embodiment that compensates for PSIJ in the mesh clock topology using a compensation buffer chain at the root of the clock tree.

FIG. 9 illustrates an exemplary bias-generator circuit which generates the body-bias signals based on $V_{dd}$.

DETAILED DESCRIPTION

The following description is presented to enable any person skilled in the art to make and use the invention, and is provided in the context of a particular example application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The present description, in the example embodiments that follow, presents various techniques for reducing power-supply-induced jitter (PSIJ) in a clock buffer circuit for a digital system, such as an integrated circuit (IC) chip. Such an IC chip can include, but is not limited to, various types of microprocessors, memory devices, application specific integrated circuits (ASIC)s, digital signal processors (DSP)s, and microcontrollers.

In a high-speed, high-performance digital system, a clock signal is used as a timing reference for data communications within the system, and the data being transmitted is typically phase-aligned or sent at 90-degrees to the clock signal. Maintenance of the correct phase relationship between the data and the clock signal in such high-performance digital systems often depends on stable clock signals. However, timing variation (jitter) in the clock signals can cause phase misalignments between the data and the clock signals to arise which can degrade system performance and cause errors.

The jitter in the clock signals may be worsened by noise in a clock-distribution circuit that distributes the clock signals, such as a clock tree. A clock-distribution circuit is typically comprised of distributed clock buffers, wherein each clock buffer amplifies a common clock signal to compensate for clock signal attenuation as the clock signal propagates through the clock-distribution circuit. However, when a clock signal is distributed by a clock buffer, power supply noise can induce jitter in the clock signal as it passes through the buffer. Such clock signal jitter caused by power supply noise may be referred to as power-supply-induced jitter (PSIJ). Furthermore, a timing delay caused by PSIJ in a clock-distribution circuit is typically cumulative because clock buffer elements are typically coupled in series, which can become a serious problem in high-speed systems.

Figure 1:
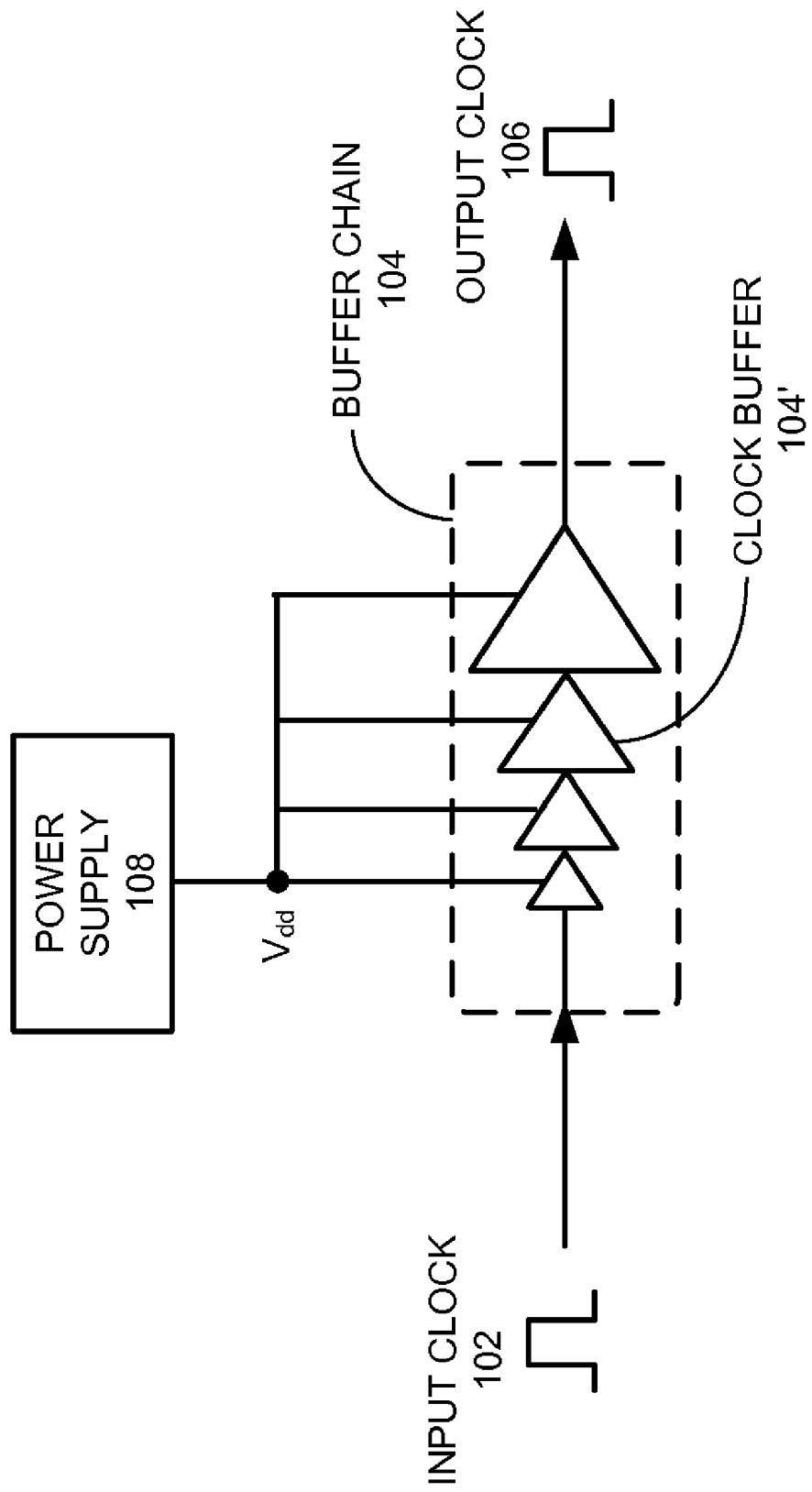
FIG. 1 presents a block diagram illustrating a typical clock path comprising a set of serially coupled clock buffers within a clock-distribution circuit.

FIG. 1 presents a block diagram illustrating a clock path comprising a set of serially coupled clock buffers within a clock-distribution circuit. As illustrated in FIG. 1, an input clock 102 propagates through a clock buffer chain (hereinafter "buffer chain") 104, which comprises a number of clock buffers coupled in series, and emerges as an output clock 106 at the end of buffer chain 104. Output clock 106 can then be used to drive multiple loads. Note that the clock buffers in buffer chain 104 (hereinafter "clock buffers 104'") are smaller in size at the clock-input side but increase in size toward the clock-output side. This configuration is useful for generating output clock 106 which can drive a large load. In some embodiments, clock buffers 104' are low-power CMOS clock buffers. Although FIG. 1 illustrates four clock buffers in buffer chain 104, in other embodiments buffer chain 104 can include fewer or more clock buffers coupled in series.

All the clock buffers in buffer chain 104 receive a common supply voltage $V_{dd}$ from power supply 108 which is coupled to the power supply node of each of the clock buffers. In a regulated power supply, supply voltage $V_{dd}$ remains at a near constant level. However, in an unregulated power supply, noise in the power supply can cause $V_{dd}$ to move up and down with time. More specifically, when $V_{dd}$ moves up, transistors in clock buffers 104' speed up, which causes the propagation delay associated with buffer chain 104 to decrease. As a result, the propagation delay associated with output clock 106 through buffer chain 104 decreases. On the other hand, when $V_{dd}$ goes down, transistors in clock buffers 104' slow down which causes the propagation delay associated with buffer chain 104 to increase. As a result, the propagation delay for output clock 106 through buffer chain 104 increases. Hence, in an unregulated power supply 108, the power supply noise causes the clock buffer propagation delay to fluctuate over time, and we refer to these fluctuations as PSIJ.

Figure 2A:
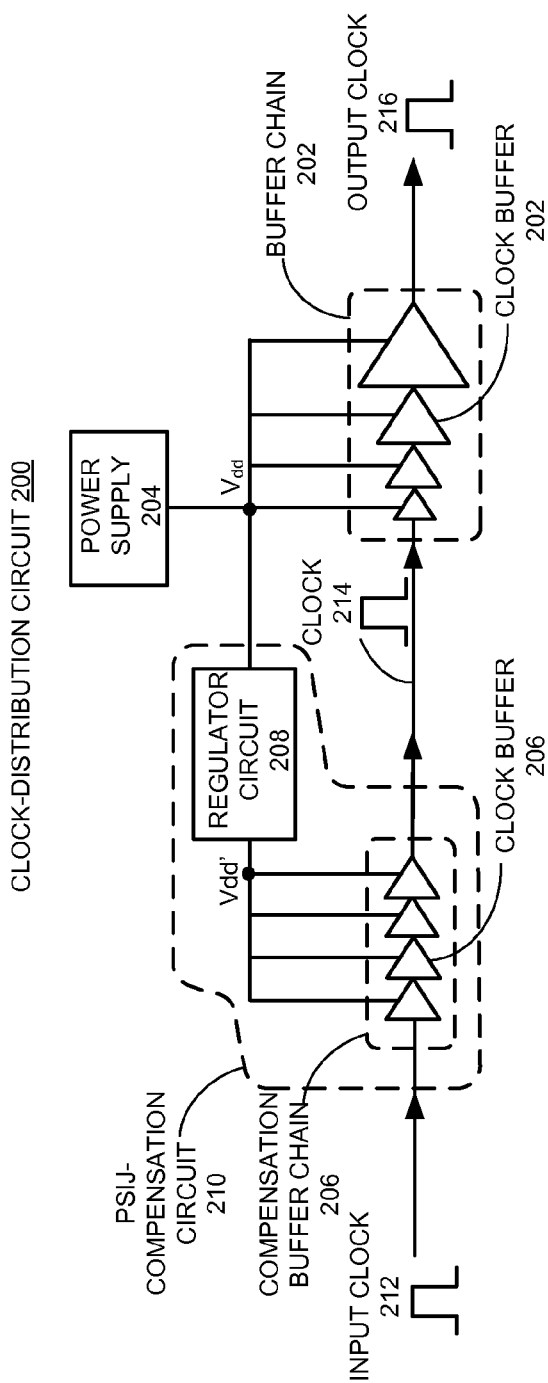
FIG. 2A presents a block diagram illustrating a clock-distribution circuit which includes a power-supply-induced jitter (PSIJ)-compensation mechanism.

FIG. 2A presents a block diagram illustrating a clock-distribution circuit 200 which includes a PSIJ compensation mechanism. More specifically, in this embodiment, clock-distribution circuit 200 is a serial clock path comprising a clock buffer chain 202, which includes a set of clock buffers (hereinafter "clock buffers 202") that receive a common supply voltage $V_{dd}$ from a power supply 204. Clock buffers 202 are coupled to power supply 204 in the same manner as in FIG. 1.

Furthermore, clock buffer chain 202 is coupled in series with a compensation buffer chain 206, which precedes clock buffer chain 202 in clock-distribution circuit 200. Compensation buffer chain 206 includes a set of clock buffers (hereinafter "clock buffers 206") that receive a common supply voltage $V_{dd}'$ from a regulator circuit 208, which is coupled between the supply nodes of clock buffers 206 and power supply 204. Note that regulator circuit 208 converts supply voltage $V_{dd}$ of power supply 204 into the new voltage signal $V_{dd}'$. Moreover, PSIJ compensation buffer chain 206 and regulator circuit 208 collectively form a PSIJ-compensation circuit 210.

During operation, regulated buffer chain 206 receives an input clock 212, and outputs a pre-compensated clock 214. Then, unregulated clock buffers 202 receive pre-compensated clock 214 as input and subsequently generate output clock 216. Because the two sets of clock buffers 202 and 206 are coupled in series, the propagation delay caused by clock-distribution circuit 200 is the combined propagation delays of the two clock buffer chains 202 and 206. While FIG. 2A illustrates four clock buffers in each of buffer chains 202 and 206, these buffer chains can generally include fewer or more clock buffers. Furthermore, the number of clock buffers in buffer chain 202 and the number of clock buffers in buffer chain 206 can be different. In an embodiment, buffer chain 206 is placed at the root of clock-distribution circuit 200, so that it can be implemented using small-size, low-power buffers which can be powered on and off rapidly and have relatively high performance while consuming relatively low power.

In some embodiments, PSIJ-compensation circuit 210 is configured to create a time compensation in pre-compensated clock 214 which is the inverse of the PSIJ in output clock 216 caused by the noise in power supply 204. More specifically, when supply voltage $V_{dd}$ increases, regulator circuit 208 causes $V_{dd}'$ to decrease. Because compensation buffers 206 receive $V_{dd}'$ as their power supply voltage, transistors in these clock buffers slow down as a result, and the propagation delay associated with compensation buffer chain 206 increases. This increase in the propagation delay in buffer chain 206 is then used to cancel out the decrease of the propagation delay in buffer chain 202 due to $V_{dd}$ increasing. On the other hand, when $V_{dd}$ decreases, regulator circuit 208 causes $V_{dd}'$ to increase. Consequently, transistors in clock buffers 206 speed up and the propagation delay associated with compensation buffer chain 206 decreases. This decrease in the propagation delay in buffer chain 206 is then used to cancel out the increase in the propagation delay in buffer chain 202 caused by the $V_{dd}$ drop.

In the above-described processes, the phase of the propagation delay variation caused by compensation clock buffers 206 is the opposite of the phase of the PSIJ in clock buffers 202. PSIJ-compensation circuit 210 provides feed-forward compensation for the subsequent PSIJ in buffer chain 202, so that the overall output clock 216 of clock-distribution circuit 200 is less sensitive to power supply noise.

Figure 2B:
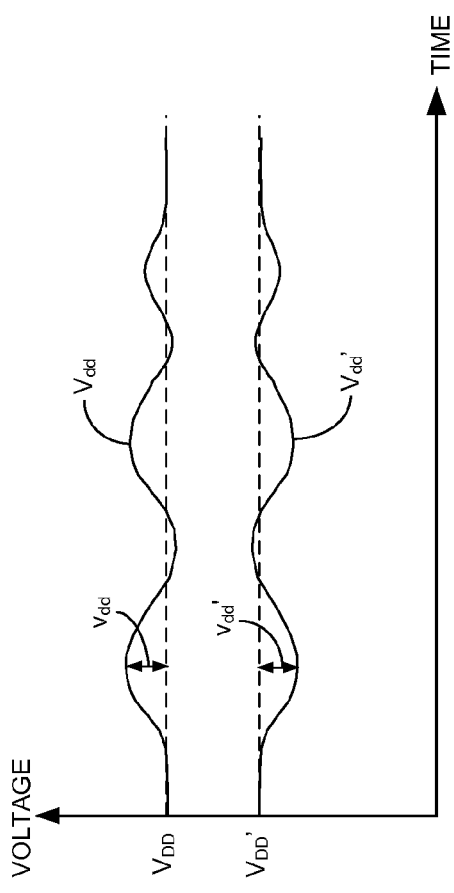
FIG. 2B illustrates timing diagrams of power supply voltage $V_{dd}$ for the regular clock buffers and power supply voltage $V_{dd}'$ for associated compensation clock buffers.

FIG. 2B illustrates voltage waveforms for power supply voltage $V_{dd}$ provided to regular clock buffers 202 and power supply voltage $V_{dd}'$ provided to compensation clock buffers 206. As illustrated in FIG. 2B, power supply voltage $V_{dd}$ comprises a static DC component $V_{DD}$ modulated by a time-varying noise component $v_{dd}$ (same conventions are used hereinafter to represent the power supply voltage, the DC component and the noise component of the power supply voltage in different embodiments). In contrast, power supply voltage $V_{dd}'$ comprises a static DC component $V_{DD}'$ which is modulated by a time-varying noise component $v_{dd}'$. While the DC components $V_{DD}$ and $V_{DD}'$ are shown to be at different levels, in some embodiments they can be made substantially equal to each other. However, noise component $v_{dd}'$ is derived based on noise component $v_{dd}$ such that $v_{dd}$ and $v_{dd}'$ are complementary to each other. Note that regulator circuit 208 in some embodiments can be calibrated so that the amount of feed-forward compensation of propagation delay produced by compensation clock buffers 206 substantially cancels out the amount of PSIJ through regular clock buffers 202. More details about calibrating regulator circuit 208 are described below.

Figure 3:
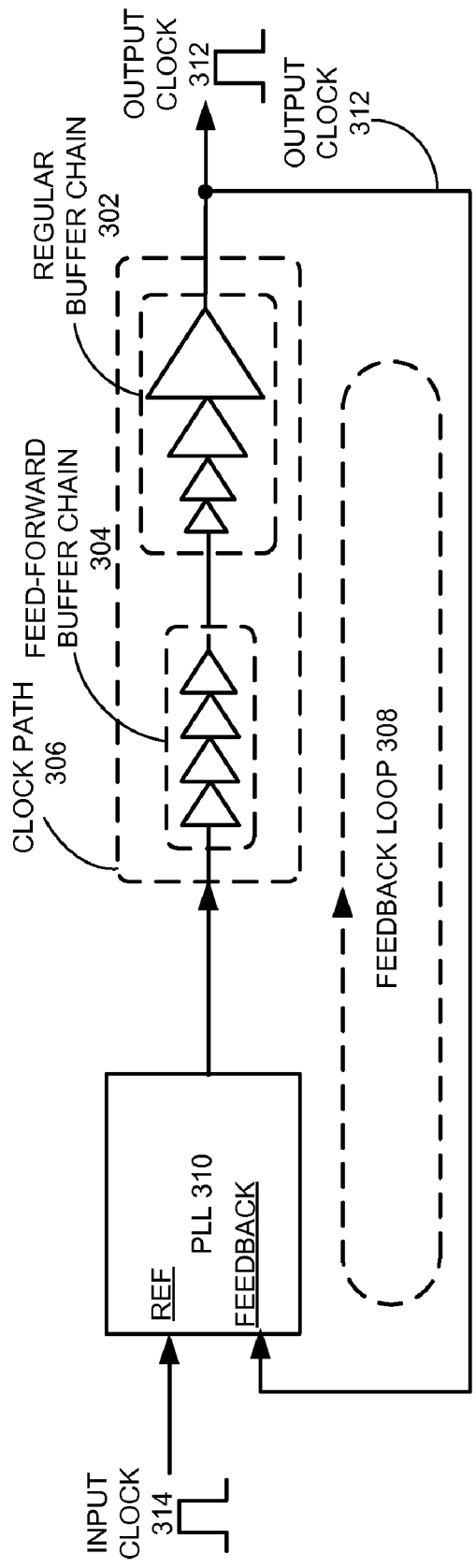
FIG. 3 presents a block diagram illustrating incorporation of a feed-forward clock buffer chain for PSIJ cancellation into a phase-locked-loop (PLL)/delay-locked-loop (DLL)-based loop to correct overall clock skew of a clock path.

FIG. 3 presents a block diagram illustrating incorporation of a feed-forward clock buffer chain for PSIJ cancellation into a phase-locked-loop (PLL)/delay-locked-loop (DLL)-based loop to correct overall clock skew through a clock path. As is illustrated in FIG. 3, a regular clock buffer chain 302 of a clock-distribution circuit is serially coupled with an associated feed-forward clock buffer chain 304 to form a clock path 306 which can reduce or cancel the PSIJ in regular buffer chain 302. PSIJ-corrected clock path 306 is embedded in a feedback loop 308 which includes a PLL 310. In some embodiments, a DLL may be used in place of PLL 310. At the end of clock path 306, a PSIJ-corrected output clock 312 is coupled back to a feedback input of PLL 310, which additionally receives a reference input clock 314 at a reference input. PLL 310 compares the feedback clock with the reference clock, and varies the phase and frequency of its output until the reference and feedback clocks are phase and frequency matched.

While feedback loop 308 uses PLL 310 to correct clock skews in clock path 306 due to delays and other factors in the clock path, this feedback operation mode is typically slow and therefore is normally performed at low operational frequency range. In comparison, PSIJ can occur at much higher speeds and higher frequency ranges than a typical response time for the PLL-based clock skew correction. In contrast, feed-forward operation mode is much faster than feedback operation mode. Hence, feed-forward buffer chain 304 can correct PSIJ in clock path 306 at a higher frequency than is possible by using feedback loop 308.

Embodiments of a regulator circuit which generates regulated power supply voltages for the compensation buffer chain are described below. Recall that in FIG. 2A, to reduce the PSIJ in the regular buffer chain, regulator circuit 208 produces an inverse transfer function of the noise in power supply 204 such that compensation buffer chain 206 has PSIJ complementary to that of the regular buffer chain.

Figure 4A:
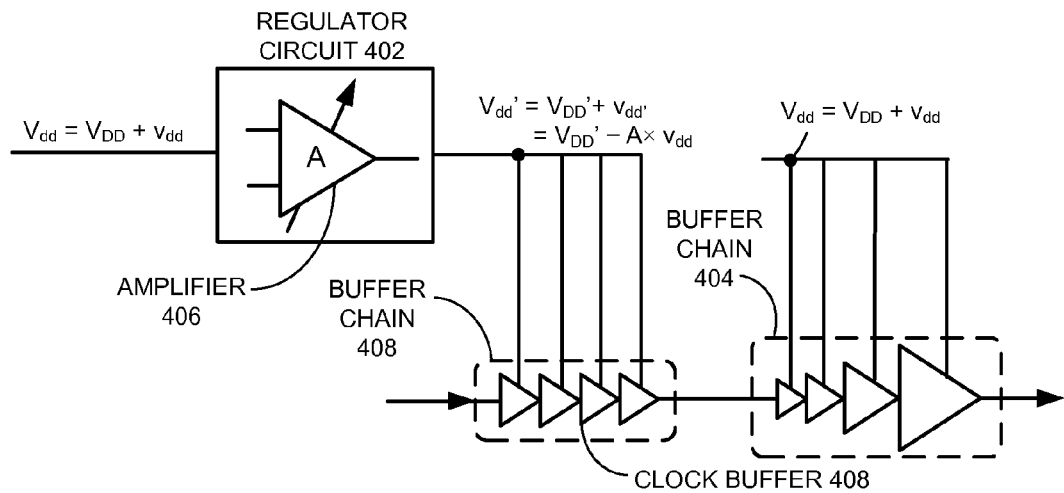
FIG. 4A illustrates an embodiment that uses a regulator circuit to create an inverse transfer function of the power supply noise.

FIG. 4A illustrates an embodiment that uses a regulator circuit 402 to create an inverse transfer function of the power supply noise. As illustrated in FIG. 4A, a regulator circuit 402 receives a power supply voltage $V_{dd}$, which is the power supply for a regular buffer chain 404. Power supply voltage $V_{dd}$ may be decomposed into a static DC component $V_{DD}$ which represents a nominal voltage level, and a time-varying component $v_{dd}$ which represents the power supply noise. Regulator circuit 402 then transforms $V_{dd}$ to generate $V_{dd}'$, which similarly comprises a static DC component $V_{DD}'$ and a time-varying noise component $v_{dd}'$. In one embodiment, $v_{dd}'$ equals $-A \times v_{dd}$, wherein A is a positive gain coefficient of an amplifier 406 within regulator circuit 402. Next, the new voltage $V_{dd}'$ is used to supply compensation buffer chain 408, which includes a set of compensation clock buffers (hereinafter "clock buffers 408"). Based on this transformation, the voltage supplied to compensation buffer chain 408 changes in the opposite direction of noise component $v_{dd}$ in the original power supply voltage $V_{dd}$. Consequently, when noise component $v_{dd}$ causes propagation delay associated with buffer chain 404 to increase, time-varying component $v_{dd}'$ causes propagation delay associated with buffer chain 408 to decrease to compensate for the PSIJ.

In an embodiment, the gain coefficient A is adjustable to precisely control the amount of clock delay produced by compensation clock buffers 408 for PSIJ cancellation purposes. In one embodiment, this is achieved by implementing amplifier 406 using a circuit which has an adjustable gain.

Figure 4B:
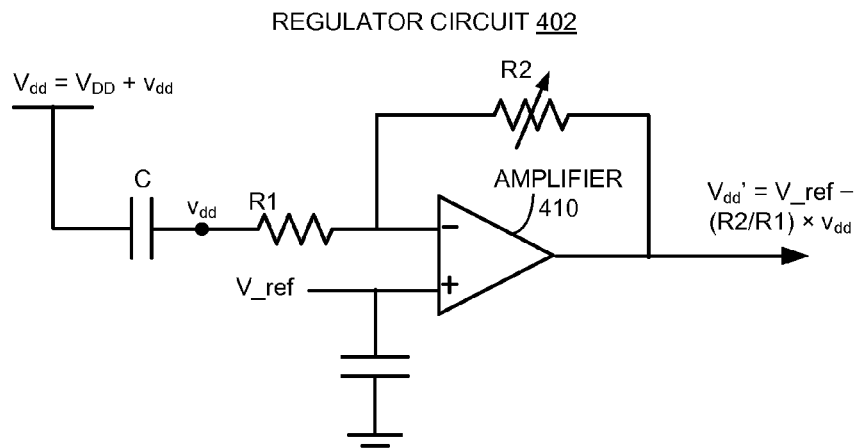
FIG. 4B illustrates an exemplary implementation of the regulator circuit in FIG. 4A.

FIG. 4B illustrates an exemplary implementation of regulator circuit 402 in FIG. 4A. In this embodiment of regulator circuit 402, power supply voltage $V_{dd}$ is compared with a static reference voltage V_ref by using an inverting operational amplifier 410 configured for a closed-loop gain of A=R2/R1, which is achieved by using resistors R1 and R2. The reference voltage V_ref can be either generated at an external voltage source, or generated on-chip, but its voltage level is stationary with respect to power supply voltage $V_{dd}$. In one embodiment, static reference voltage V_ref is obtained by low-pass filtering power supply voltage $V_{dd}$. For example, by low-pass filtering $V_{dd}$ in FIG. 4A, high-frequency noise component $v_{dd}$ can be largely removed and a stable DC voltage $V_{DD}$ produced to be used as V_ref. In the embodiment illustrated in FIG. 4B, V_ref is the input to the non-inverting input of amplifier 410.

Additionally, power supply voltage $V_{dd}$ is high-pass-filtered prior to comparing it with reference voltage V_ref. This can be achieved, for example, by using a DC-blocking capacitor C or other types of high-pass filters. As a result, DC component $V_{DD}$ is substantially removed from $V_{dd}$, and only the noise component $v_{dd}$ remains after capacitor C. Amplifier 410 and resistors R1 and R2 produce an output $V_{dd}'$=V_ref−(R2/R1)×$v_{dd}$. Hence, regulator circuit 402 in FIG. 4B produces an inverse transfer function of power supply noise $v_{dd}$. In the embodiment of FIG. 4B, an adjustable gain R2/R1 is achieved by using a tunable feedback resistor R2. Other amplifier configurations which can produce a negative and variable gain for noise component $v_{dd}$ can be used in place of regulator circuit 402 in FIG. 4B.

Note that capacitor C and resistor R1 form a high-pass filter in transferring time-varying noise component $v_{dd}$ to the amplifier circuit. Furthermore, the amplifier circuit of FIG. 4B will typically have a low-pass response, limiting the maximum frequency of operation. As a result, the time-varying output component $v_{dd}'$ will typically be approximately equal to $-A \times v_{dd}$ between the filter high-pass corner frequency and the amplifier circuit low-pass corner frequency. In some embodiments, PSIJ at frequencies below the high-pass corner frequency may be compensated by other means, such as PLL/DLL circuits or active CDR loops. In other embodiments, power supply voltage $V_{dd}$ may be coupled to an amplifier without the DC blocking capacitor, so that $v_{dd}'$ can compensate for noise component $v_{dd}$ at even lower frequencies. In yet other embodiments, communication systems may not be sensitive to low frequency noise, and it is acceptable to tolerate high-pass response from C and R1 with no performance penalty.

Figure 4C:
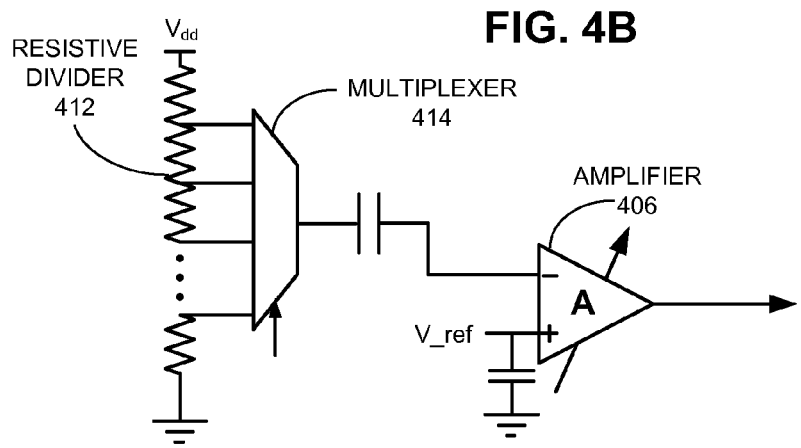
FIG. 4C illustrates an embodiment that selects a percentage of the power supply noise as input to the variable gain amplifier.

FIG. 4C illustrates an embodiment that selects a percentage of the power supply noise as an input to variable gain amplifier 406. As illustrated in FIG. 4C, instead of using the full power supply voltage $V_{dd}$ as an input to amplifier 406, a resistive divider 412 is used to select only a portion of $V_{dd}$, which is subsequently filtered and compared with V_ref. During clock delay calibration, a multiplexer 414 can be used to select a desirable portion of $V_{dd}$ through resistive divider 412. This embodiment provides an alternative control mechanism for the clock delay coefficient calibration process which is described below. In one embodiment, amplifier 406 in FIG. 4C can be replaced with a fixed gain amplifier. In this embodiment, the amount of clock delay compensation produced by the compensation buffer chain is controlled by resistive divider 412.

Figure 5:
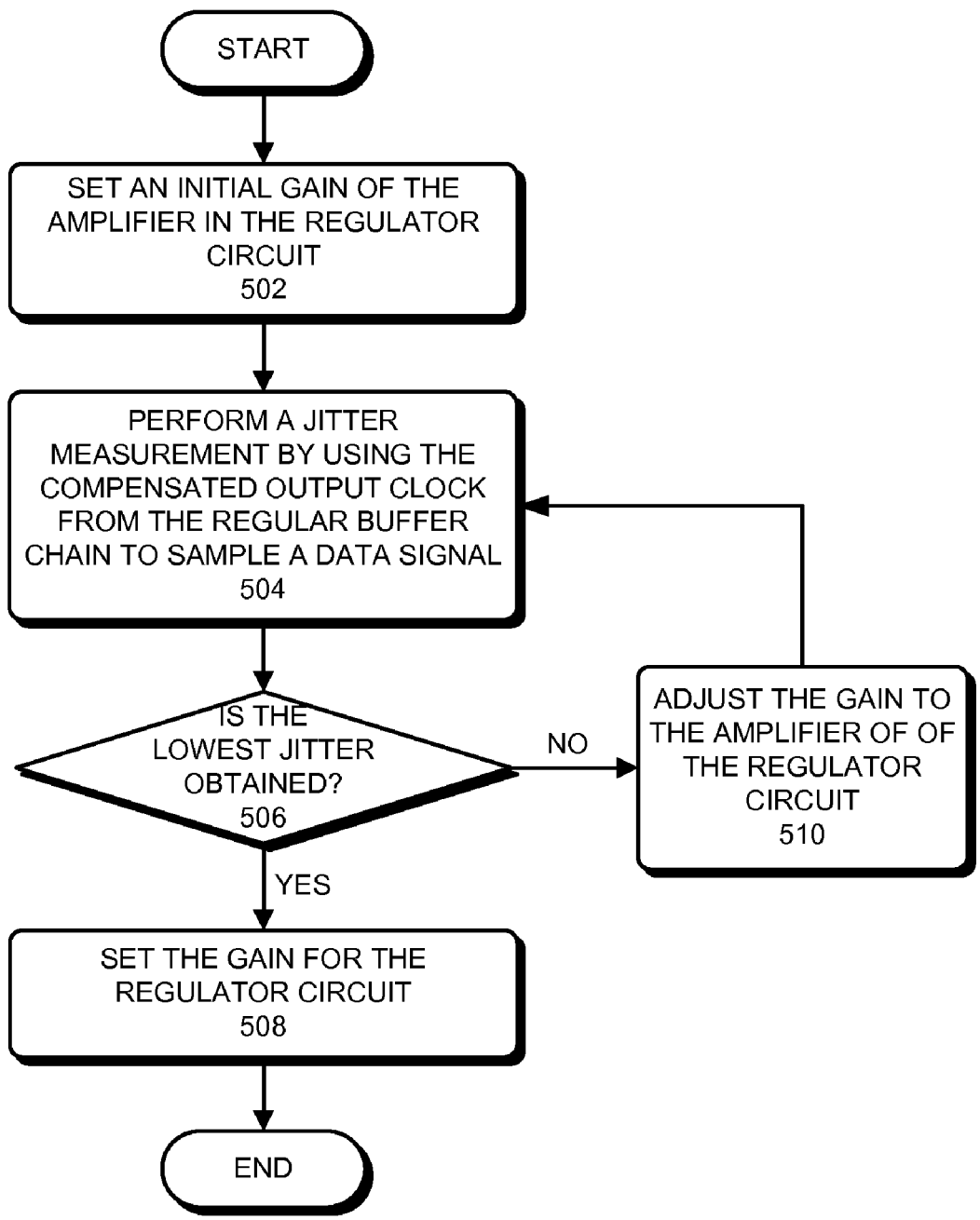
FIG. 5 presents a flowchart illustrating an exemplary process for calibrating the gain of the regulator circuit to control the amount of clock delay compensation produced by a given compensation clock buffer.

FIG. 5 presents a flowchart illustrating an exemplary process for calibrating the gain of regulator circuit 402 to control the amount of compensation produced by one of compensation clock buffers 408 in FIG. 4A. During operation, the system starts by setting an initial gain for the amplifier in the regulator circuit (step 502). The system subsequently performs a jitter measurement by using the compensated output clock from the regular buffer chain to sample a source-synchronous data signal (step 504).

In one embodiment, the jitter measurement is performed using a "shmoo" calibration technique. More specifically, the system starts with the clock edge at the center of a data eye and moves the clock edge in one direction until the sampled output becomes incorrect. The system then records the clock edge position as the first clock position. From the first clock position, the system then moves the clock edge in the opposite direction until the sampled output becomes incorrect. The amount of clock edge movement from the first clock position determines the width of an eye opening, which is complementary to the width of the jitter "fuzz band," which includes the total system PSIJ. By doing this shmoo calibration, the system determines the amount of jitter at the current gain setting for the regulator circuit. Alternately, the vertical eye opening (i.e., voltage margin) or total eye area can be used as system metrics for optimization.

The system then determines if a lowest possible jitter has been obtained (step 506). In one embodiment, the system compares the newly computed jitter with a jitter from the last jitter measurement. If so, the current setting of the regulator circuit has achieved a sufficient PSIJ reduction and the system sets the gain for the regulator circuit (step 508). Otherwise, the system adjusts the gain to the amplifier of the regulator circuit (step 510), and then repeats the jitter measurement of step 504, until the lowest possible jitter is eventually obtained.

The above-described calibration process can be performed during a power-on sequence or periodically during normal system operation. Typically, this calibration is performed in conjunction with a total timing delay calibration, which is performed separately using a PLL-based feedback loop similar to the one in FIG. 3.

FIGS. 6A and 6B illustrate embodiments that use feed-forward clock buffers to compensate for PSIJ in a mesh clock topology 600. More specifically, mesh clock topology 600 comprises a clock source 602, a clock tree 604 which splits the main clock source into multiple clock paths, and a clock wiring mesh 606 which distributes the clock signals to loads coupled to the grid points of mesh 606. Clock tree 604 further comprises a set of clock buffers which typically receive supply voltage from a common power supply, and hence are subject to PSIJ. In some embodiments, clock buffers 608 are CMOS clock buffers.

FIG. 6A illustrates an embodiment that compensates for PSIJ in a mesh clock topology 600 by individually compensating each regular clock buffer 608 in clock tree 604. As illustrated in FIG. 6A, each regular clock buffer 608 in clock tree 604 is paired with a feed-forward compensation buffer 610 which immediately precedes the corresponding regular clock buffer. While clock buffers 608 receive supply voltage from a common power supply, compensation buffers 610 receive a regulated supply voltage produced by a regulator circuit described in conjunction with FIGS. 2-4 above. Consequently, each compensation buffer 610 produces a controlled clock delay compensation which cancels the PSIJ of a corresponding clock buffer 608. Note that each PSIJ-compensated buffer pair 612 provides localized PSIJ cancellation. The topology of FIG. 6A therefore achieves a PSIJ-insensitive clock at each node in clock tree 604. In some embodiments, the order of the two types of buffers in a PSIJ-compensated buffer pair 612 is reversed.

FIG. 6B illustrates an embodiment that compensates for PSIJ in mesh clock topology 600 using a compensation buffer chain 614 at the root of clock tree 604. While regular clock buffers 608 receive their supply voltage from a common power supply, compensation buffer chain 614 receives a regulated supply voltage produced by a regulator circuit described in conjunction with FIGS. 2-4 above. Because of the symmetry in the clock tree 604, all clock paths in clock tree 604 between root buffer 616 and clock wiring mesh 606 have substantially the same amount of PSIJ. Consequently, compensation buffer chain 614 which is placed at the root of clock tree 604 generates a controllable amount of clock delay compensation which cancels the PSIJ in each clock path in clock tree 604. Moreover, because compensation buffers 614 are placed at the root of the clock source, they can have smaller sizes and hence consume less power.

Figure 7A:
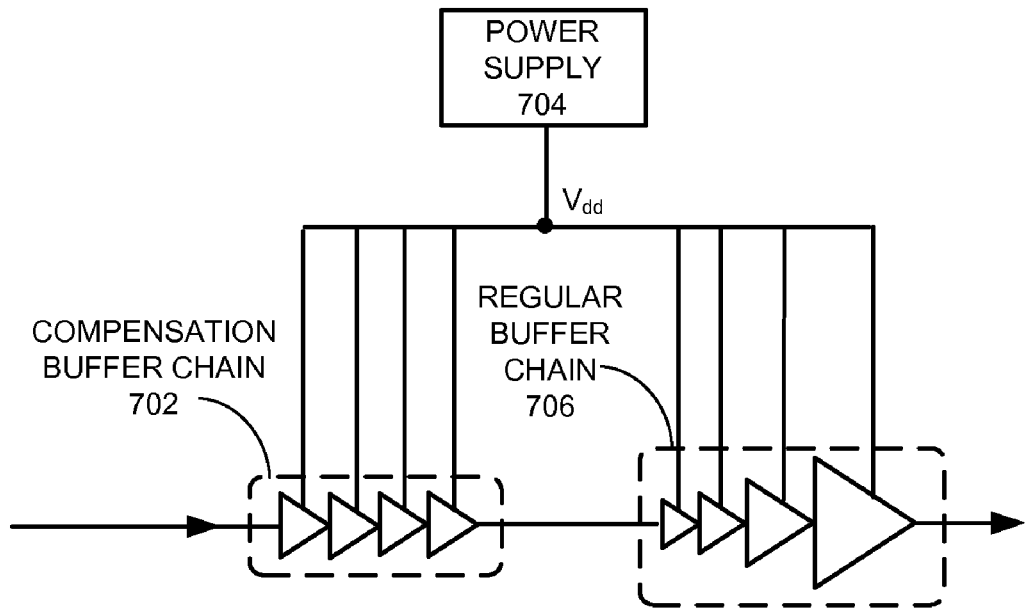
FIG. 7A illustrates a clock-distribution circuit that uses a feed-forward compensation buffer chain without requiring a regulator circuit.

FIG. 7A illustrates a clock-distribution circuit 700 which uses a feed-forward compensation buffer chain 702 without requiring a regulator circuit. In comparison to the embodiment of FIG. 4A, clock-distribution circuit 700 in FIG. 7A is configured such that a power supply 704 provides supply voltage $V_{dd}$ directly to power supply nodes of both a regular buffer chain 706 and compensation buffers in compensation buffer chain 702. In this embodiment, to compensate for PSIJ in clock buffer chain 706, the compensation buffers need to have an inverse clock delay behavior in response to the noise component in power supply 704.

Figure 7B:
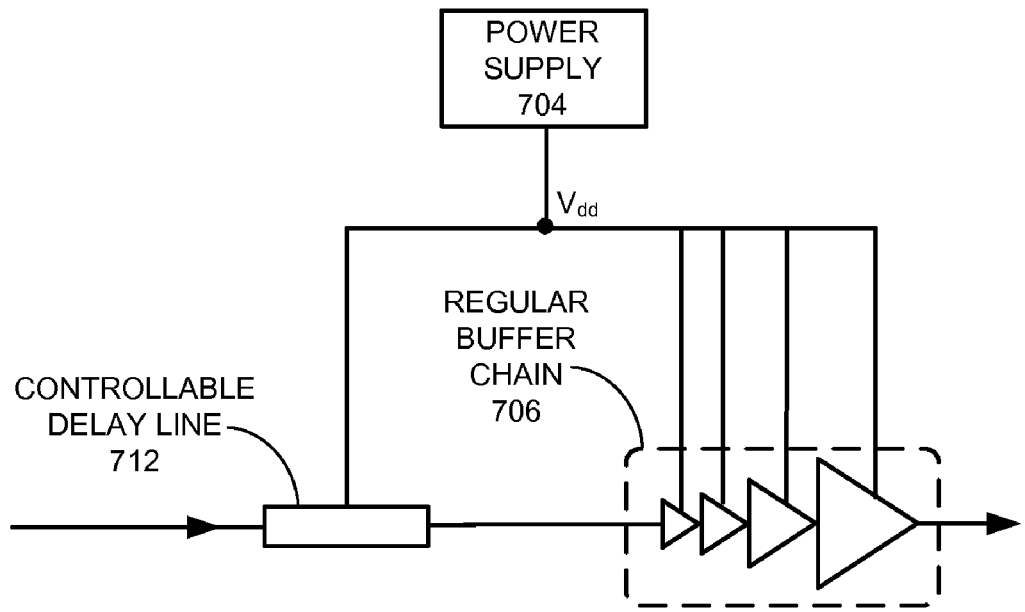
FIG. 7B illustrates a clock-distribution circuit obtained by replacing the compensation buffer chain in FIG. 7A with a feed-forward delay line.

While above-described techniques control compensation clock buffer delays through the power supply node of the compensation buffer chain, other embodiments may provide feed-forward PSIJ compensation based on other controls. FIG. 7B illustrates a clock-distribution circuit 710 obtained by replacing compensation buffer chain 702 in FIG. 7A with a feed-forward delay line 712. More specifically, power supply 704 is used to control the amount of delay compensation produced by delay line 712. Delay line 712 can comprise delay buffers, or other delay mechanisms. Power supply 704 provides a control signal for delay line 712 to produce a compensating clock delay which is complementary to the PSIJ of regular buffer chain 706. In one embodiment, delay line 712 includes a variable capacitor and the amount of delay is modulated by controlling the variable capacitor using the power supply signal. In some embodiments, a regulator circuit is coupled between power supply 704 and delay line 712 to convert the power supply signal into a control signal for feed-forward delay line 712.

The above-described embodiments provide various feed-forward techniques for PSIJ compensation using a compensation buffer chain coupled in series with a regular buffer chain. However, in some embodiments, feed-forward PSIJ compensation can be achieved without using compensation clock buffers. Instead, the feed-forward compensation can be achieved by directly controlling a property of the regular buffer chain.

Figure 8A:
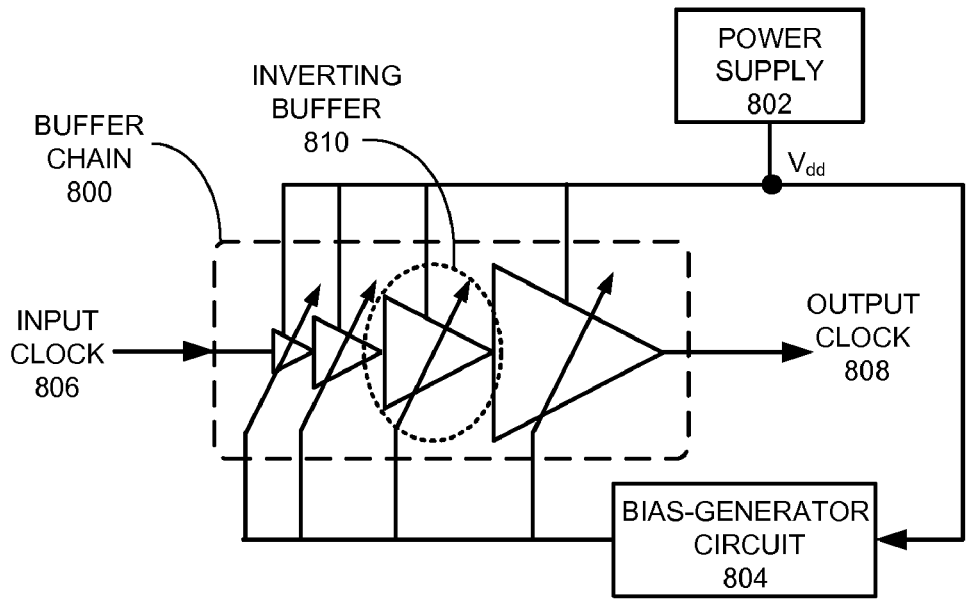
FIG. 8A illustrates a regular buffer chain which includes a feed-forward PSIJ compensation mechanism on each of the clock buffers.

For example, FIG. 8A illustrates a regular buffer chain 800 which includes a feed-forward PSIJ compensation mechanism on each of the clock buffers. More specifically, buffer chain 800 comprises a set of clock buffers 810 which receive a common power supply voltage $V_{dd}$ from a power supply 802. A feed-forward PSIJ compensation mechanism includes a bias-generator circuit 804 which is coupled between each clock buffer 810 and power supply 802. In some embodiments, bias-generator circuit 804 is configured to convert the power supply voltage $V_{dd}$ from power supply 802 into one or more bias voltages, and then use the one or more bias voltages to control the clock delay through buffer chain 800. In one embodiment, this bias voltage is the body-bias voltage for each transistor in an inverter clock buffer. During operation, buffer chain 800 receives an input clock 806. As input clock 806 propagates down buffer chain 800, each clock buffer 810 adds a PSIJ component from the power supply 802, and a compensating PSIJ component from bias-generator circuit 804 into the clock. Hence, the PSIJ is compensated in real-time at each clock buffer 810. As a result, buffer chain 800 outputs a PSIJ-compensated output clock 808 without requiring an additional compensation buffer chain.

Figure 8B:
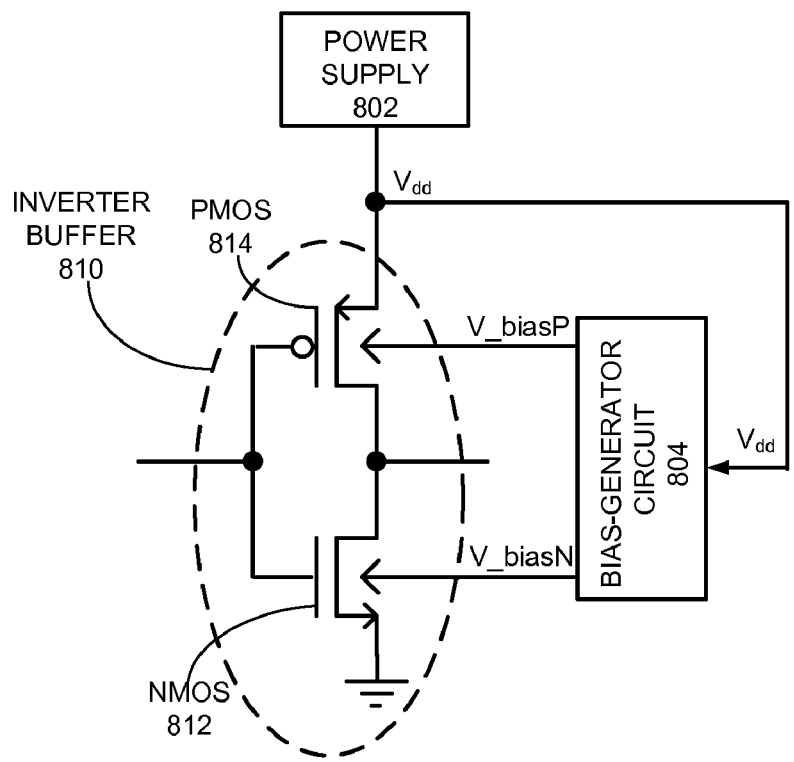
FIG. 8B illustrates an embodiment which includes a feed-forward PSIJ compensation mechanism which operates by biasing body of CMOS transistors in one of the inverting buffers in FIG. 8A.

FIG. 8B illustrates an embodiment which includes a feed-forward PSIJ compensation mechanism which operates by adjusting the body-bias of transistors in one of the inverting buffers in FIG. 8A. As shown in FIG. 8B, inverting buffer 810 comprises an NMOS transistor 812 and a PMOS transistor

814. The source of PMOS transistor 814 is tied to $V_{dd}$ of power supply 802, while the source of NMOS transistor 812 is coupled to ground. Bias-generator circuit 804 receives $V_{dd}$, which contains a noise component, and generates two bias signals: V_biasN which is used to bias the body of NMOS transistor 812, and V_biasP which is used to bias the body of PMOS transistor 814. By controlling the body bias voltages of the two transistors, the bias signals adjust the operating speed of these transistors. For example, increasing V_biasP causes PMOS transistor 814 to slow down, and decreasing V_biasN causes NMOS transistor 812 to slow down. On the other hand, decreasing V_biasP causes PMOS transistor 814 to speed up, and increasing V_biasN causes NMOS transistor 812 to speed up.

To reduce PSIJ in inverting buffer 810, the body bias signals V_biasN and V_biasP cause transistors 812 and 814 to speed up and slow down such that clock delay changes in the opposite direction to the associated PSIJ caused by the power supply noise $v_{dd}$. In some embodiments, bias signals V_biasN, V_biasP are made complementary to each other, so that PMOS transistor 814 and NMOS transistor 812 both speed up or both slow down by the same amount. In some embodiments, V_biasN, V_biasP are made independent of each other so that NMOS transistor 812 and PMOS transistor 814 speed up and slow down independently. In some embodiments, this technique may further be used to adjust duty cycle distortion in the clock signal. In some embodiments, only one of the two body-bias signals is used to control only NMOS transistor 812 or PMOS transistor 814 instead of both.

FIG. 9 illustrates an exemplary bias-generator circuit 804 which generates the body-bias signals based on $V_{dd}$. The bias-generator circuit 804 in FIG. 9 includes two sub-circuits. Sub-circuit 902 generates the body-bias signal V_biasN for NMOS transistor 812 in inverting buffer 810. More specifically, sub-circuit 902 includes an amplifier 904 which receives two inputs: power supply voltage $V_{dd}$ and a static DC component $V_{DD}$. DC voltage $V_{DD}$ may be obtained by low-pass filtering $V_{dd}$ as shown in FIG. 9. In this embodiment, the difference between $V_{dd}$ and $V_{DD}$ is the power supply noise $v_{dd}$. Amplifier 904 amplifies $v_{dd}$ to generate an output voltage at node B. During operation, when $V_{dd}$ increases, the voltage level at node B also increases, which subsequently causes a current through PMOS 906 to decrease. As a result, voltage at node C, i.e., V_biasN, decreases as well. As described above, a decreased V_biasN subsequently causes NMOS transistor 812 to slow down, thereby increasing clock delay on buffer 810. Recall that when $V_{dd}$ increases, the regular clock buffer delay increases. Hence, NMOS body-bias signal V_biasN produced by sub-circuit 902 provides feed-forward PSIJ compensation in NMOS transistor 812 in inverting buffer 810.

On the other hand, sub-circuit 908 generates the body-bias signal V_biasP for PMOS transistor 814 in inverting buffer 810. More specifically, sub-circuit 908 includes an amplifier 910 which also receives $V_{dd}$ and $V_{DD}$ as inputs, wherein the difference between $V_{dd}$ and $V_{DD}$ is the power supply noise $v_{dd}$. Note that $V_{DD}$ may be obtained by low-pass filtering $V_{dd}$ as shown in FIG. 9. Amplifier 910 amplifies $v_{dd}$ to generate an output voltage at node D. In some embodiments, the gain of amplifier 910 may be different than the gain of amplifier 904. During operation, when $V_{dd}$ increases, the voltage level at node D decreases, which causes the current through NMOS transistor 912 to decrease. As a result, the voltage at node E, i.e., V_biasP, increases. As described above, an increased V_biasP subsequently causes PMOS transistor 814 to slow down, thereby increasing clock delay on buffer 810. Hence, the PMOS transistor's body-bias signal V_biasP produced by sub-circuit 908 provides feed-forward PSIJ compensation at PMOS transistor 814 in inverting buffer 810. When $V_{dd}$ decreases, the described processes reverse directions and feed-forward PSIJ compensation is again achieved in inverting buffer 810. Note that when controlled by sub-circuits 902 and 908, both transistors in buffer 810 speed up and slow down similarly in response to a change in $V_{dd}$.

Figure 10:
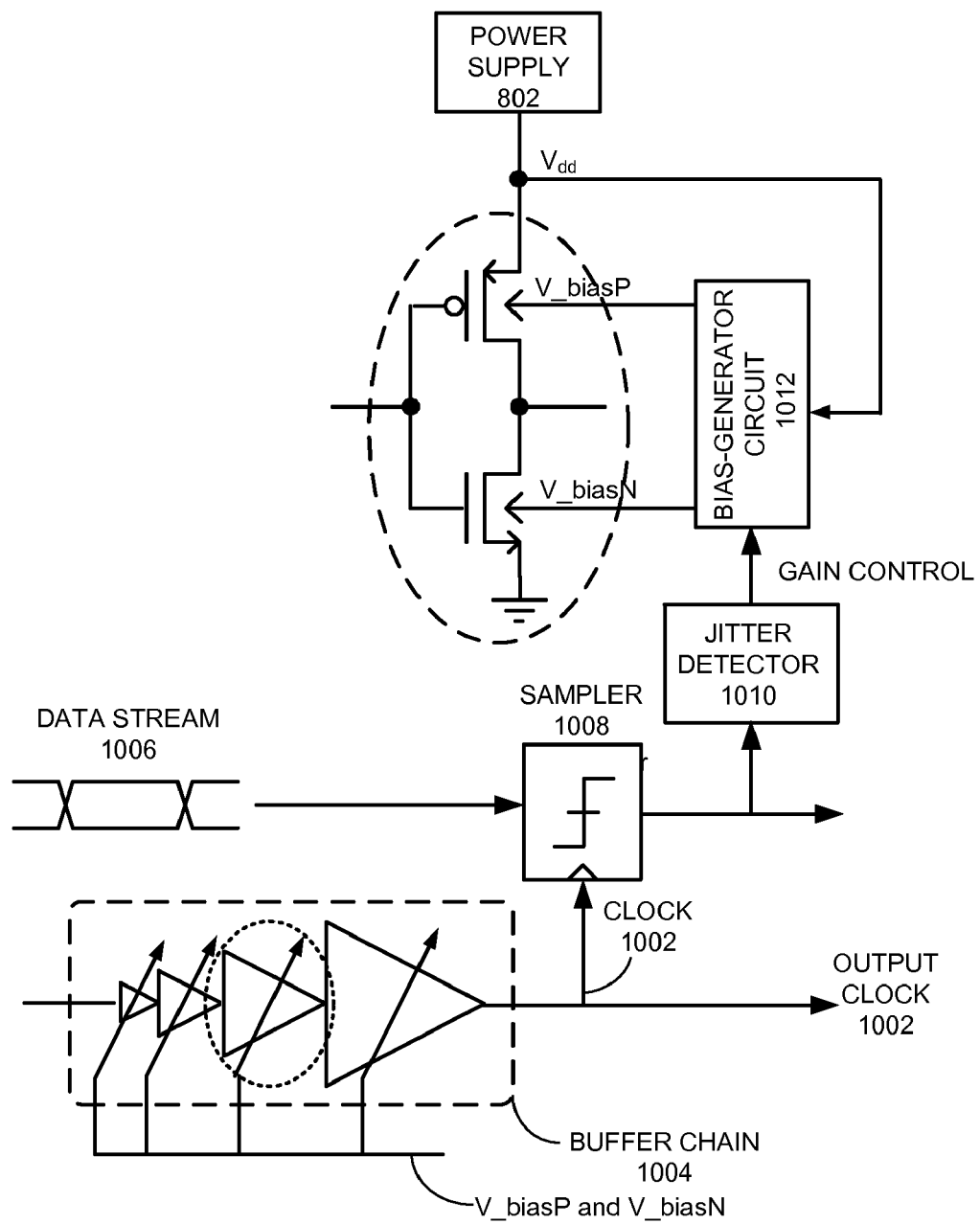
FIG. 10 illustrates a feedback mechanism for calibrating gains of a body-bias-generator circuit for PSIJ compensation.

Note that each different clock distribution system can have a different power supply noise spectrum, power supply noise sensitivity, and body-bias response. A calibration process can be used to determine the proper gains for the feed-forward compensation circuit for a given clock distribution system. FIG. 10 illustrates a feedback mechanism for calibrating gains of a body-bias-generator circuit for PSIJ compensation.

In some embodiments, the DC input $V_{DD}$ in FIG. 9 is replaced by a DC reference voltage V_ref which is not derived from the noisy supply voltage $V_{dd}$. In other words, V_ref is independent of power supply voltage $V_{dd}$ and hence is not subject to the supply noise $v_{dd}$, even at low frequencies. Instead, V_ref can be either generated at an external stable voltage source, or generated on-chip with a regulator circuit. These embodiments, therefore, facilitate PSIJ compensation at even lower frequencies than the configurations used in FIG. 9.

As illustrated in FIG. 10, an output clock 1002 from a clock buffer chain 1004 is used to sample data stream 1006 at a sampler 1008, wherein data stream 1006 and output clock 1002 may be source-synchronized. Sampler 1008 outputs sampled data which is then fed into a jitter detector 1010. Jitter detector 1010 can be implemented using different techniques. For example, jitter detector can be implemented using a fuzz band detector which was described in conjunction with FIG. 5. Output from jitter detector 1010 typically includes jitter from both data and clock signals. The jitter detector's output is used to adjust the individual gains of the two body-bias-signal generators in bias-generator circuit 1012, for example, the individual gains of the amplifiers 904 and 910 in FIG. 9. Bias-generator circuit 1012 subsequently generates new body-bias signals to apply to transistors in buffer chain 1004. This adjusts the timing relationship between the output clock 1002 and data stream 1006, and affects the output of sampler 1008. Next, jitter is again measured by jitter detector 1010 and the process repeats to form a calibration loop. In some embodiments, this calibration loop continues until the jitter in the sampled data is minimized or reduced below a given threshold. At this point, the gains of amplifiers in bias-generator circuit 1012 can be set for normal system operation.

This above-described calibration process can be performed during a power-on sequence or periodically during normal system operation. Typically, this calibration process is performed in conjunction with a total timing delay calibration, which is performed separately using a PLL-based feedback loop.

When a symmetrical bias generator circuit, such as circuit 804, is used, the calibration process only needs to adjust a common gain setting for both amplifiers. In this way, bias signals V_biasN and V_biasP can be generated as complementary signals which are obtained by shifting from their nominal values in opposite directions by the same amount. Note that such complementary bias signals typically do not affect clock duty cycles.

In some embodiments, the bias signals V_biasN and V_biasP for the NMOS and PMOS transistors can be individually adjusted to compensate for duty cycle distortions of the clock as it propagates through a clock buffer chain. This duty cycle distortion can be caused by clock buffer skew, such as a mismatch between the PMOS and NMOS transistors. In some embodiments, a duty cycle adjustment can be accomplished by adjusting the nominal levels of the bias signals V_biasN and V_biasP on the transistors. Typically, the nominal levels of the bias signals are set to be substantially complementary for NMOS and PMOS transistors. In one embodiment, to compensate for duty cycle distortion, the nominal levels are adjusted individually for the two transistors to create an imbalance between the two transistors which can be used to compensate for the duty cycle distortion. Note that this duty cycle adjustment operation may be performed prior to the PSIJ calibration or concurrently with the PSIJ calibration.

Figure 11:
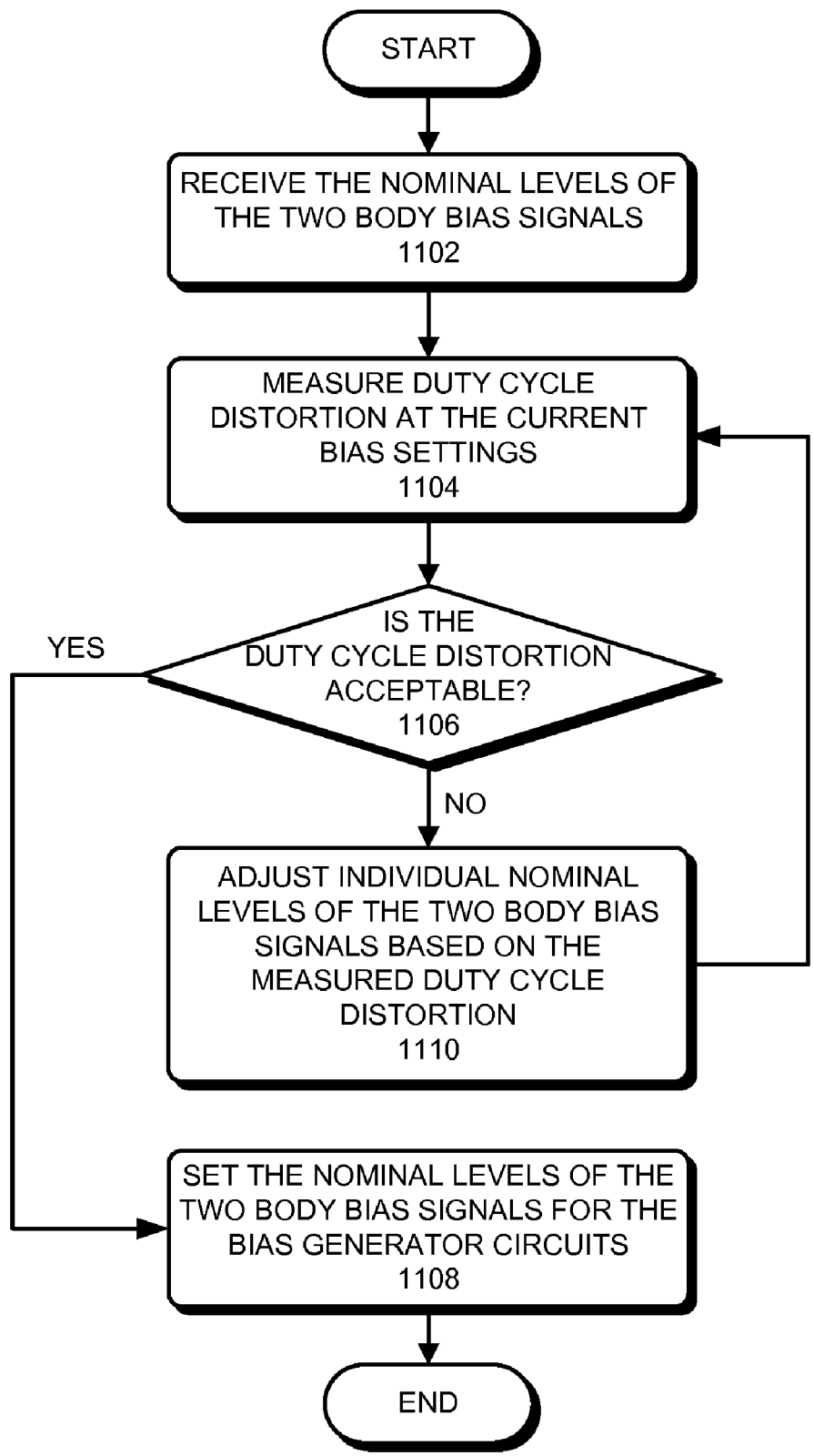
FIG. 11 presents a flowchart illustrating a process of adjusting body biases for NMOS and PMOS transistors for compensating duty cycle distortion.

FIG. 11 presents a flowchart illustrating a process of adjusting body biases for NMOS and PMOS transistors for compensating duty cycle distortion.

During operation, the system first receives the nominal levels of the two body bias signals for NMOS and PMOS transistors (step 1102). Typically, the nominal levels of the two body bias signals are complementary DC biases on the NMOS and PMOS transistors. The system then measures duty cycle distortion at the current bias settings (step 1104). In one embodiment, this measurement is performed by using the target clock signal to sample a data stream, and then extracting duty cycle distortion from the sampled data. In particular, during double data rate (DDR) operation, duty cycle distortion can be extracted from the two sampled data streams associated with the even and odd samplers. In another embodiment, the measurement is performed by a duty cycle detection circuit that directly monitors the duty cycle of the buffer's output clock.

Next, the system determines if the duty cycle distortion is below an acceptable threshold (step 1106). If so, the system sets the nominal levels of the two body bias signals for the bias generator circuits (step 1108), and duty cycle adjustment is complete. Otherwise, the system adjusts individual nominal levels of the two body bias signals based on the measured duty cycle distortion (step 1110). The system then returns to step 1104 and repeats the adjustment loop until the duty cycle distortion becomes acceptable.

Note that, in addition to controlling the transistor's body bias voltages within an inverting buffer for PSIJ compensation, clock buffer delay can be controlled through proper biasing of other properties of a clock buffer. For example, the output impedance of an inverting buffer may be configured to be adjustable based on a bias signal generated from the power supply voltage $V_{dd}$.

Figure 12A:
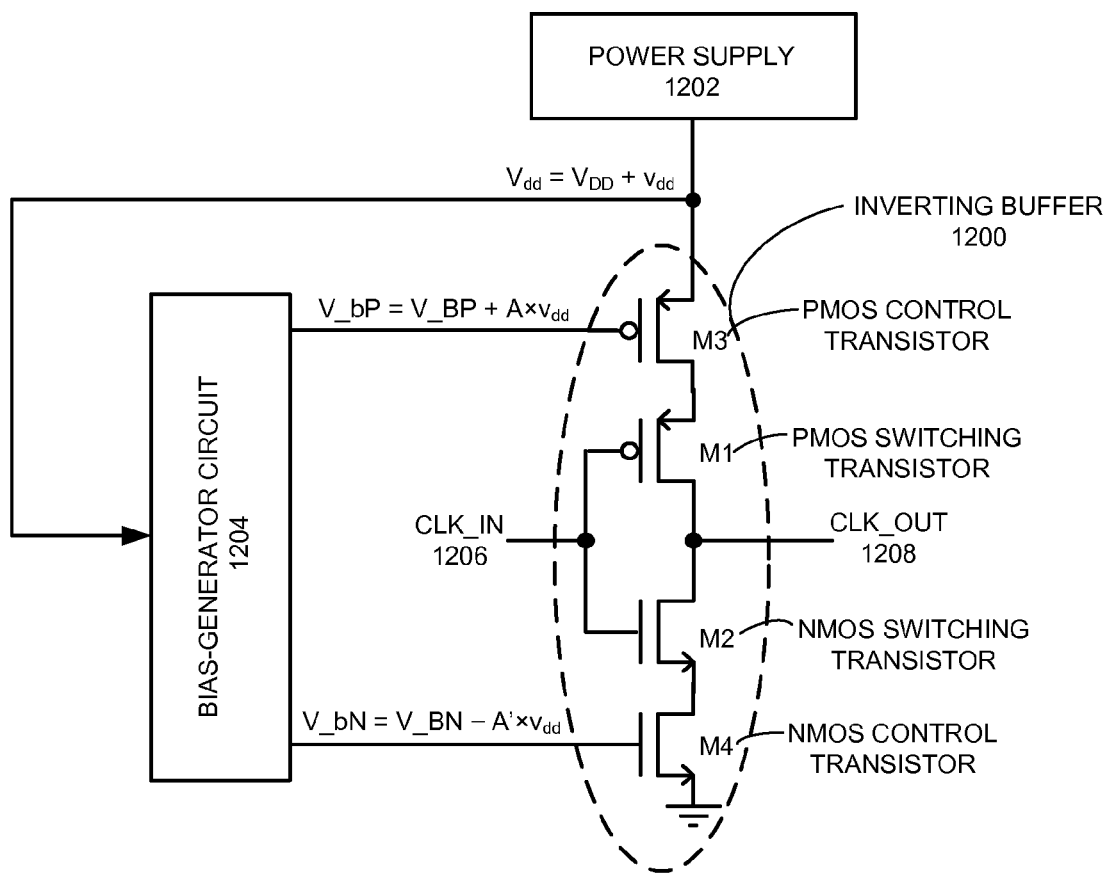
FIG. 12A illustrates an embodiment which includes a feed-forward PSIJ compensation mechanism which operates by adjusting the output impedance of an inverting buffer.

FIG. 12A illustrates an embodiment which includes a feed-forward PSIJ compensation mechanism which operates by adjusting the output impedance of an inverting buffer 1200. As illustrated in FIG. 12A, inverting buffer 1200 comprises two switching transistors, i.e., PMOS switching transistor M1 and NMOS switching transistor M2, which are coupled in the same manner as inverting buffer 810. Inverting buffer 1200 further comprises a PMOS control transistor M3, which is coupled in series with PMOS switching transistor M1 at the source of the transistor M1, and a NMOS control transistor M4, which is coupled in series with NMOS switching transistor M2 at the source of the transistor M2. The source of PMOS control transistor M3 is tied to $V_{dd}$ of power supply 1202, while the source of NMOS control transistor M4 is coupled to ground. In some embodiments, 4-transistor inverting buffer 1200 can be used to construct a buffer chain in a clock-distribution circuit.

A bias-generator circuit 1204 receives $V_{dd}$ as an input, which contains a DC component $V_{DD}$ and a noise component $v_{dd}$, and subsequently generates two control signals: V_bP which is used to control the gate voltage of PMOS control transistor M3, and V_bN which is used to control the gate voltage of NMOS control transistor M4. By controlling the gate voltages of the two control transistors M3 and M4, these control transistors operate to minimize the PSIJ associated with inverting buffer 1200. By controlling the gate voltages of the two control transistors M3 and M4, an effective output impedance of the inverting buffer can be maintained substantially constant in the presence of a supply noise, thereby facilitating minimizing the PSIJ.

For example, when input clock CLK_IN 1206 to inverting buffer 1200 switches to low, and the power supply noise $v_{dd}$ becomes positive, then the gate drive |Vgs| of switching transistor M1 increases. This increasing gate drive causes the output impedance of M1 to decrease, which then leads to a faster rising output transition in output clock CLK_OUT 1208. In one embodiment, to compensate for this PSIJ, bias generator circuit 1204 generates a control signal V_bP=V_BP+A×$v_{dd}$ on the gate of PMOS control transistor M3, wherein A is a positive gain which can be adjusted and calibrated. Note that this control signal includes a DC term V_BP which sets the nominal operating point for the control transistor M3. In some embodiments, V_BP is set to substantially equal to the ground potential. The second term of the control signal V_bP is an adjustment term generated based on the noise component $v_{dd}$. Hence, when $v_{dd}$ becomes positive, the gate drive |Vgs| of control transistor M3 decreases, which then causes the output impedance of M3 to increase. Because M1 and M3 are coupled in series, the overall effect is that the total output impedance of the two PMOS transistors remains approximately constant, thereby compensating for PSIJ in CLK_OUT 1208.

In a similar manner, NMOS control transistor M4 operates to control the effective total NMOS output impedance of both M2 and M4 during the rising input clock transitions. In one embodiment, bias generator circuit 1204 generates a control signal V_bN=V_BN−A'×$v_{dd}$ on the gate of NMOS control transistor M4, wherein A' is a positive gain which can be adjusted and calibrated. Note that A' may be different from A which is set for V_bP. In some embodiments, V_BN is substantially equal to the DC component $V_{DD}$ to set the nominal operation point of control transistor M4.

Figure 12B:
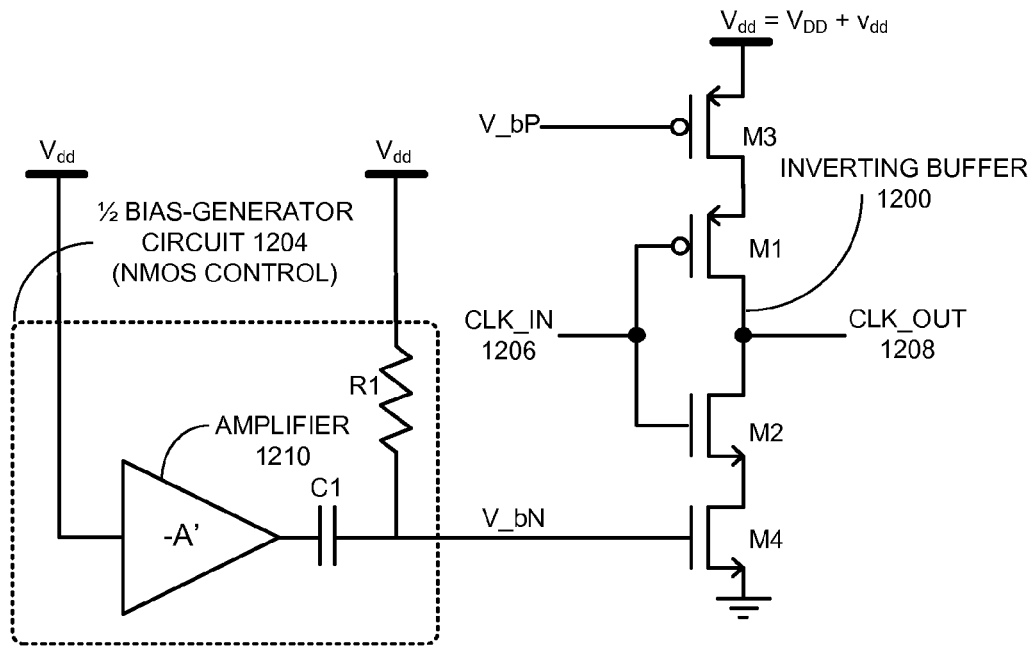
FIG. 12B illustrates an embodiment of half of the bias generator circuit in FIG. 12A, which generates NMOS bias voltage $V\_bN = V_{DD} - A' \times v_{dd}$.

FIG. 12B illustrates an embodiment of half of bias generator circuit 1204 in FIG. 12A, which generates NMOS bias voltage V_bN=$V_{DD}$−A'×$v_{dd}$. More specifically, half bias-generator circuit 1204 in FIG. 12B includes an amplifier 1210 having an amplifier gain of −A' (A'>0), a DC blocking capacitor C1, and a resistor R1 coupled between the power supply node $V_{dd}$ and gate of control transistor M4. In some embodiments, both C1 and R1 have very large values. This configuration sets a nominal bias voltage V_BN to $V_{DD}$ on the gate of transistor M4. In this way, NMOS transistors M2 and M4 are nominally biased at substantially the same DC voltage level during the high level periods of input clock CLK_IN 1206. Note that capacitor C1 and resistor R1 operate as a high-pass filter for amplifier 1210's output signal, such that amplifier 1210 is effective when the noise component $v_{dd}$ has a frequency above the corner frequency of the high-pass filter. In one embodiment, amplifier gain −A' can be calibrated to achieve maximum PSIJ cancellation by using a calibration system similar to the one illustrated in FIG. 10. Although not shown in FIG. 12B, the other half of bias generator circuit 1204 which generates PMOS bias voltage V_bP=$V_{DD}$+A×$v_{dd}$ can be similarly constructed.

Figure 12C:
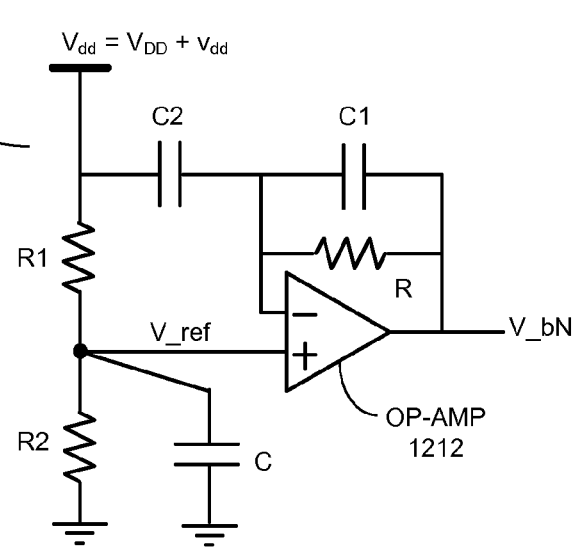
FIG. 12C illustrates an embodiment of the amplifier in FIG. 12B based on an operational amplifier (op-amp).

FIG. 12C illustrates an embodiment of amplifier 1210 in FIG. 12B based on an operational amplifier (op-amp) 1212. More specifically, amplifier 1210 in FIG. 12C includes resistors R1, R2 and capacitor C, which form a low-pass filter to establish a reference voltage V_ref which equals a fraction of the DC voltage $V_{DD}$. V_ref is then used as a reference voltage that is independent of voltage noise $v_{dd}$ at frequencies above the low-pass filter cutoff frequency. Op-amp 1212 can be one of many common op-amp topologies. In some embodiments, op-amp 1212 is designed with high open-loop gain, so that the closed-loop gain of amplifier 1210 can be approximately determined by the components in the feedback network of amplifier 1210. For example, the closed-loop gain of amplifier 1210 may be approximately determined by capacitors C1 and C2 as −C2/C1.

Figure 12D:
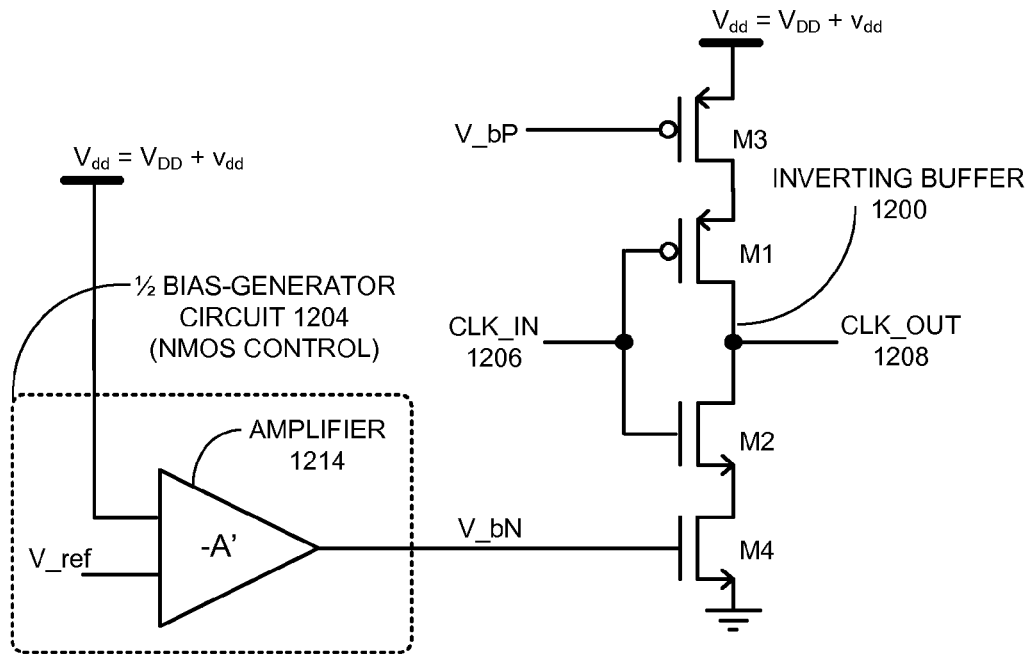
FIG. 12D illustrates another embodiment of half of the bias generator circuit in FIG. 12A, which generates NMOS bias voltage $V\_bN = V\_BN - A' \times v_{dd}$.

FIG. 12D illustrates another embodiment of half of bias generator circuit 1204 in FIG. 12A, which generates NMOS bias voltage V_bN=V_BN−A'×$v_{dd}$. More specifically, half bias-generator circuit 1204 in FIG. 12D includes an amplifier 1214 having an amplifier gain of −A' (A'>0). Unlike FIG. 12B, half bias-generator circuit 1204 does not use DC blocking capacitors, and therefore facilitates tracking supply noise component $v_{dd}$ at much lower frequencies. In this embodiment, the DC bias V_BN on transistor control M4 is generated by amplifier 1214. Because amplifier 1214 cannot produce output swings that go beyond the supply voltage, the DC level V_BN is typically smaller than $V_{DD}$. Consequently, when input clock CLK_IN 1206 is high, transistors M2 and M4 may not be biased at the same bias point.

In some embodiments, to facilitate amplifying supply noise component $v_{dd}$, the reference voltage V_ref is designed to be substantially independent of power supply voltage $V_{dd}$. An on-chip or off-chip reference voltage generator, such as a bandgap circuit or other bias circuit, may be used to generate V_ref. In some embodiments, if V_ref is partially dependent on $V_{dd}$, the dependency effect on V_ref may be compensated by adjusting the amplifier gain −A'.

Figure 12E:
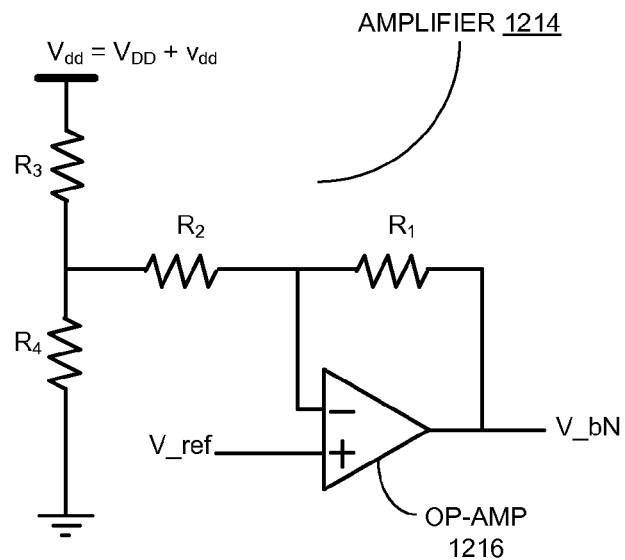
FIG. 12E illustrates an embodiment of the amplifier in FIG. 12D based on an op-amp.

FIG. 12E illustrates an embodiment of amplifier 1214 in FIG. 12D based on an op-amp 1216. Similar to the embodiment in FIG. 12C, the embodiment in FIG. 12E can use a high open-loop gain op-amp 1216 so that the closed-loop gain of amplifier 1216 from supply noise input to the amplifier output is substantially determined by resistor values R1, R2, R3, and R4.

Figure 13:
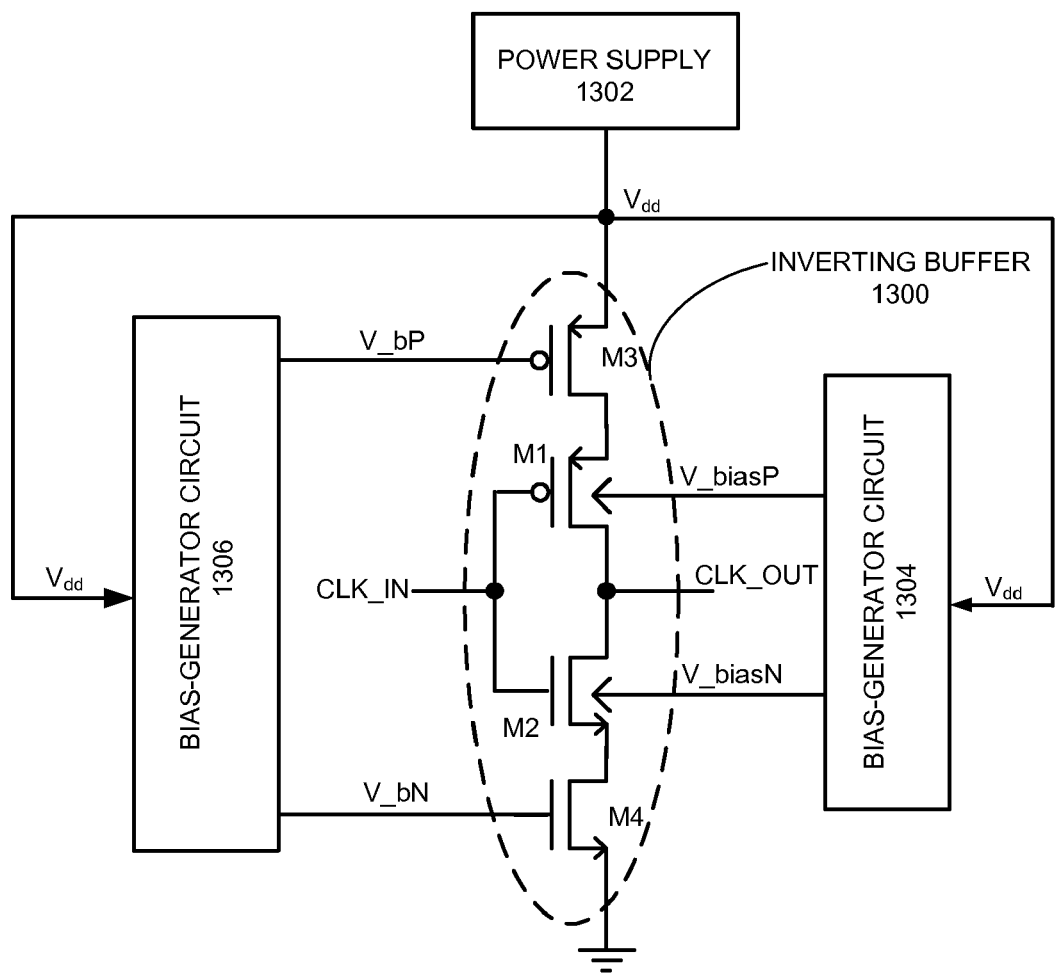
FIG. 13 illustrates an embodiment which uses both body-biasing and output-impedance modulation on the switching transistors for PSIJ compensation in an inverting buffer.

FIG. 13 illustrates an embodiment which uses both body-biasing modulation and output-impedance modulation on the switching transistors for PSIJ compensation in an inverting buffer 1300. Similar to inverting buffer 1200, inverting buffer 1300 includes two switching transistors M1 and M2, and two control transistors M3 and M4. Inverting buffer 1300 receives a noisy supply voltage $V_{dd}$ from power supply 1302. Bias-generator circuit 1304 receives $V_{dd}$ as input and generates body-bias signals V_biasP and V_biasN for switching transistors M1 and M2, respectively. Separately, bias-generator circuit 1306, which is independent of bias-generator circuit 1304, receives the same $V_{dd}$ and generates gate-bias signals V_bP and V_bN for control transistors M3 and M4, respectively.

In some embodiments, only one of the two types of PSIJ compensation mechanisms in FIG. 13 is selected to be active during operation. In other embodiments, both types of PSIJ compensation mechanisms in FIG. 13 are selected to be active during operation to improve the PSIJ compensation performance. In the embodiments when both types of compensation are combined, the system may attempt to generate a sufficient amount of compensation to invert the $V_{dd}$ effect for an entire buffer chain in the smaller inverter stages, thereby not requiring compensation circuitry for larger inverter stages of the same buffer chain.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An integrated circuit comprising,
   a first chain of clock buffers, wherein each clock buffer in the first chain receives a first supply voltage from a first voltage source, wherein a change in the first supply voltage causes a change in a first propagation delay associated with the first chain of the clock buffers; and
   a second chain of clock buffers coupled in series with the first chain of clock buffers, wherein each clock buffer in the second chain is coupled to the first voltage source through coupling circuitry between the first voltage source and the second chain of clock buffers, such that the change in the first supply voltage causes a change in a second propagation delay associated with the second chain of the clock buffers,
   wherein the change in the first propagation delay and the change in the second propagation delay are complementary.

2. The integrated circuit of claim 1, wherein the integrated circuit includes a clock-distribution circuit.

3. The integrated circuit of claim 1, wherein the coupling circuitry is configured to:
   generate a second supply voltage based on the change of the first supply voltage; and
   provide the second supply voltage to a power supply node in each clock buffer in the second chain of clock buffers,
   wherein the second supply voltage increases when the first supply voltage decreases, and the second supply voltage decreases when the first supply voltage increases.

4. The integrated circuit of claim 1, wherein a clock signal that propagates through both the first chain of clock buffers and the second chain of clock buffers is substantially insensitive to a noise in the first voltage source.

5. The integrated circuit of claim 3, wherein the second supply voltage substantially equals a reference voltage minus the change in the first supply voltage multiplied by a gain coefficient, wherein the reference voltage is substantially independent of the first voltage source.

6. The integrated circuit of claim 5, wherein the reference voltage is obtained from an external voltage source or an on-chip voltage source.

7. The integrated circuit of claim 5, wherein the reference voltage is obtained by low-pass filtering the first supply voltage.

8. The integrated circuit of claim 5, wherein the coupling circuit includes a differential amplifier having a variable gain, and wherein the second supply voltage is obtained by comparing the first supply voltage with the reference voltage using the differential amplifier.

9. The integrated circuit of claim 8, wherein the second supply voltage is adjusted by adjusting the variable gain of the differential amplifier.

10. The integrated circuit of claim 1, wherein the integrated circuit is embedded in a feedback loop for calibrating the second supply voltage to reduce a jitter in a clock delay associated with a clock signal that propagates through both the first chain of clock buffers and the second chain of clock buffers.

11. The integrated circuit of claim 1, wherein the second chain of clock buffers is located at a root of a clock tree.

12. The integrated circuit of claim 1, wherein the first chain of clock buffers and the second chain of clock buffers each comprise a single clock buffer, wherein the single clock buffer in the first chain and the single clock buffer in the second chain form a clock-jitter-compensation unit, which is used as a clock buffer within a clock tree.

13. A method for compensating for power-supply-induced jitter in a first chain of clock buffers within an integrated circuit, the method comprising:
coupling a first supply voltage from a first voltage source to a supply node of each clock buffer in the first chain, wherein a change in the first supply voltage causes a change in a first propagation delay associated with the first chain of the clock buffers;
coupling a second chain of clock buffers in series with the first chain of clock buffers;
coupling the first voltage source to each clock buffer in the second chain of clock buffers through coupling circuitry; and
adjusting the coupling circuitry so that the change in the first supply voltage from the first voltage source causes a change in a second propagation delay associated with the second chain of the clock buffers,
wherein the change in the first propagation delay and the change in the second propagation delay are complementary.

14. The method of claim 13, wherein the method comprises using the coupling circuitry to:
generate a second supply voltage based on the change of the first supply voltage; and
provide the second supply voltage to a power supply node in each clock buffer in the second chain of clock buffers.

15. The method of claim 14, wherein the method further comprises:
causing the second supply voltage to increase when the first supply voltage decreases; and
causing the second supply voltage to decrease when the first supply voltage increases.

16. The method of claim 14, wherein the method further comprises causing the second supply voltage to substantially equal a reference voltage minus the change in the first supply voltage multiplied by a gain coefficient, wherein the reference voltage is substantially independent of the first voltage source.

17. The method of claim 16, wherein the method further comprises obtaining the reference voltage from an external voltage source or an on-chip voltage source.

18. The method of claim 16, wherein the method further comprises obtaining the reference voltage by low-pass filtering the first supply voltage.

19. The method of claim 16, wherein the method further comprises obtaining the second supply voltage by comparing the first supply voltage with the reference voltage using a differential amplifier having a variable gain.

20. The method of claim 19, wherein adjusting the coupling circuitry involves adjusting the variable gain of the differential amplifier.

21. The method of claim 13, wherein the method further comprises using a feedback loop to calibrate the coupling circuitry.

22. The method of claim 13, wherein the method further comprises placing the second chain of clock buffers at a root of a clock tree.

23. The method of claim 13, wherein the first chain of clock buffers and the second chain of clock buffers comprise a single clock buffer in each of the chains, wherein the single clock buffer in the first chain and the single clock buffer in the second chain form a clock-jitter-compensation unit, which is used as a clock buffer within a clock tree.

24. The method of claim 13, wherein a clock signal that propagates through both the first chain of clock buffers and the second chain of clock buffers is substantially insensitive to a noise in the first voltage source.

25. An integrated circuit comprising:
a clock buffer, which receives a supply voltage from a voltage source, wherein a change in the supply voltage causes a first change in a propagation delay associated with the clock buffer; and
coupling circuitry coupled between the voltage source and the clock buffer, wherein the coupling circuitry generates one or more control signals based on the change in the supply voltage, and uses the one or more control signals to control a property of the clock buffer, such that the change in the supply voltage causes a second change in the propagation delay associated with the clock buffer,
wherein the first change in the propagation delay and the second change in the propagation delay are complementary.

26. The integrated circuit of claim 25, wherein the property of the clock buffer controlled by the one or more control signals is a body bias voltage of a transistor in the clock buffer.

27. The integrated circuit of claim 26, wherein the clock buffer includes a CMOS inverter, wherein a first bias signal in the one or more control signals provides a body bias voltage to an NMOS transistor in the CMOS inverter, and a second bias signal in the one or more control signals provides a body bias voltage to a PMOS transistor in the CMOS inverter.

28. The integrated circuit of claim 25, wherein the coupling circuitry includes a detection circuit which detects the change of the supply voltage by comparing the supply voltage with a low-pass filtered version of the supply voltage.

29. The integrated circuit of claim 27, wherein the coupling circuitry includes a first converting circuit for converting the change of the supply voltage into the first bias signal and a second converting circuit for converting the change of the supply voltage into the second bias signal.

30. The integrated circuit of claim 27, wherein the integrated circuit is embedded in a feedback loop for calibrating the first bias signal and the second bias signal in order to reduce a jitter in a clock delay associated with a clock signal that propagates through the clock buffer, wherein the first bias signal and the second bias signal are complementary.

31. The integrated circuit of claim 25, wherein the clock buffer is coupled in series with one or more other clock buffers in a clock-distribution circuit.

32. The integrated circuit of claim 25, wherein the property of the clock buffer controlled by the one or more control signals is an output impedance of the clock buffer.

33. The integrated circuit of claim 25, wherein a clock signal that propagates through the clock buffer is substantially insensitive to a noise in the voltage source.

34. A method for compensating for power-supply-induced jitter in a clock buffer within an integrated circuit, the method comprising:
coupling a supply voltage from a voltage source to a supply node of the clock buffer, wherein a change in the supply voltage causes a first change in a propagation delay associated with the clock buffer;
generating one or more control signals based on the change in the supply voltage using coupling circuitry coupled between the voltage source and the clock buffer; and
using the one or more control signals to control a property of the clock buffer, such that the change in the supply voltage causes a second change in the propagation delay associated with the clock buffer;

wherein the first change in the propagation delay and the second change in the propagation delay are complementary.

35. The method of claim 34, wherein the property of the clock buffer controlled by the one or more control signals is a body bias voltage of a transistor in the clock buffer.

36. The method of claim 35, wherein the clock buffer includes a CMOS inverter, and wherein using the one or more control signals to control the body bias voltage of the clock buffer involves:
   providing a first bias signal in the one or more control signals as a body bias voltage to an NMOS transistor in the CMOS inverter; and
   providing a second bias signal in the one or more control signals as a body bias voltage to a PMOS transistor in the CMOS inverter.

37. The method of claim 34, wherein the method further comprises detecting the change of the supply voltage by comparing the supply voltage with a low-pass filtered version of the supply voltage.

38. The method of claim 36, wherein the method further comprises converting the change of the supply voltage into the first bias signal and the second bias signal.

39. The method of claim 36, wherein the method further comprises using a feedback loop to calibrate the first bias signal and the second bias signal to reduce a jitter in a clock delay associated with a clock signal that propagates through the clock buffer, wherein the first bias signal and the second bias signal are complementary.

40. The method of claim 34, wherein the property of the clock buffer controlled by the one or more control signals is an output impedance of the clock buffer.

41. The integrated circuit of claim 34, wherein a clock signal that propagates through the clock buffer is substantially insensitive to a noise in the voltage source.

* * * * *